United States Patent
Landes et al.

(10) Patent No.: US 7,032,862 B2
(45) Date of Patent: Apr. 25, 2006

(54) METHOD AND SYSTEM FOR MOUNTING RADIO AVIONICS

(76) Inventors: Mark James Landes, 13141 Hubbard Ave., Sylmar, CA (US) 91342; Victor D. L'Esperance, 228 W. Bonita Ave., Claremont, CA (US) 91711

( * ) Notice: Subject to any disclaimer, the term of this patent is extended or adjusted under 35 U.S.C. 154(b) by 222 days.

(21) Appl. No.: 10/391,039

(22) Filed: Mar. 17, 2003

(65) Prior Publication Data

US 2003/0183730 A1 Oct. 2, 2003

Related U.S. Application Data

(60) Provisional application No. 60/394,119, filed on Jul. 3, 2002, provisional application No. 60/365,482, filed on Mar. 18, 2002.

(51) Int. Cl.
*B64C 1/00* (2006.01)
*A47H 1/00* (2006.01)
(52) U.S. Cl. .............. 244/129.1; 211/103; 211/126.15; 211/187; 211/207; 211/125.1; 248/125.1
(58) Field of Classification Search .................. 211/26, 211/103, 126.15, 187, 207; 248/125.1, 295.11; 244/1 R, 129.1
See application file for complete search history.

(56) References Cited

U.S. PATENT DOCUMENTS

| | | | | |
|---|---|---|---|---|
| 5,208,735 A | * | 5/1993 | Twachtmann et al. | 361/725 |
| 5,372,265 A | * | 12/1994 | Monch | 211/187 |
| 5,695,078 A | * | 12/1997 | Otema | 211/103 |
| 6,322,040 B1 | * | 11/2001 | Robertson et al. | 248/636 |
| 6,410,995 B1 | * | 6/2002 | Grouse et al. | 307/64 |
| 6,549,424 B1 | * | 4/2003 | Beseth et al. | 361/801 |

* cited by examiner

*Primary Examiner*—J. Woodrow Eldred
(74) *Attorney, Agent, or Firm*—Stoneman Law Offices, Ltd.; Martin L. Stoneman

(57) ABSTRACT

A mounting bar system permitting infinite adjustability in mounting avionics-components trays and Dzus-mounted avionics in at least one aircraft cockpit instrument panel assembly. Each mounting bar is slotted along its longitudinal axis. The slot is made to include the shape of a T such that a wider channel exists below the opening of the slot. Spring-loaded nut assemblies set to receive mounting screws from the avionics-components trays are fit within the T slot. Friction provided by the spring holds the nut assembly at any desired location within the T slot. As the nut assembly can be positioned at any location within the T slot, the mounting bar can readily be adjusted to support any avionics-components tray intended for at least one aircraft cockpit instrument panel assembly.

27 Claims, 13 Drawing Sheets

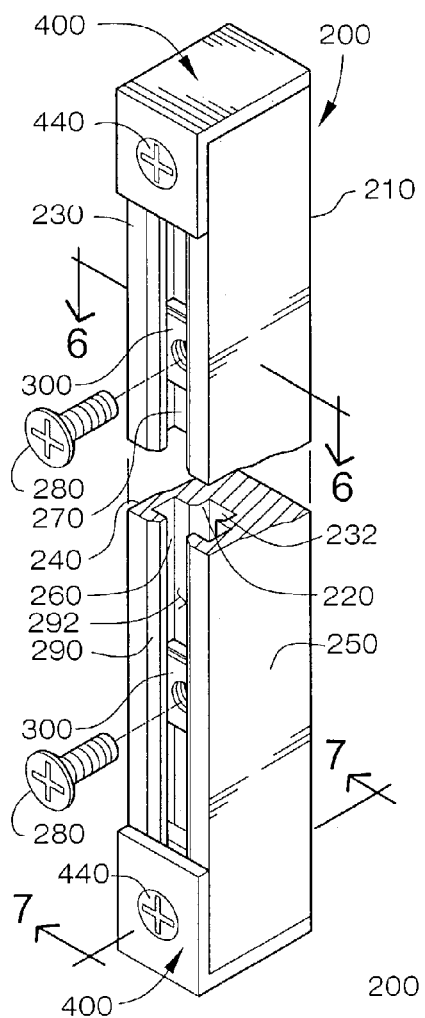
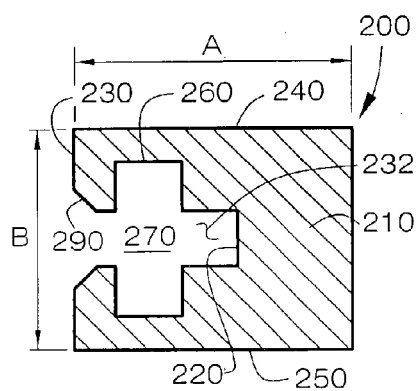
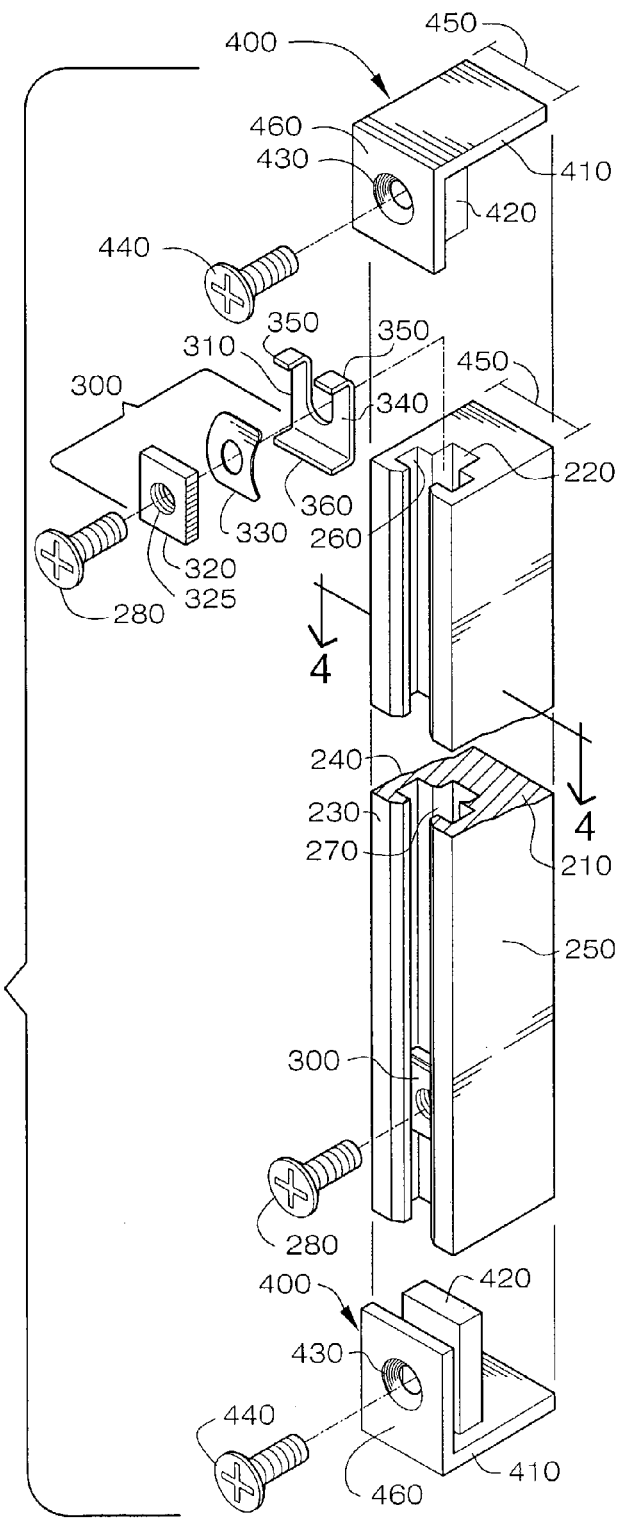
FIG. 3
FIG. 4
FIG. 5

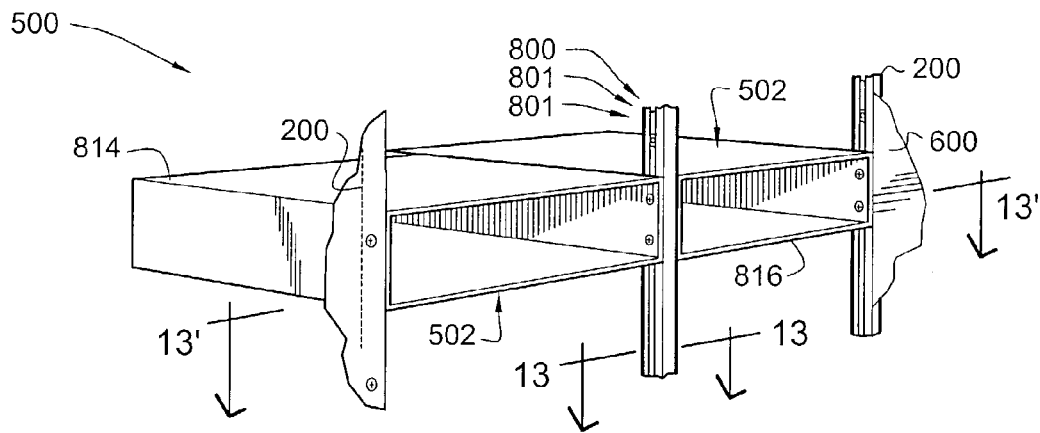
FIG. 12
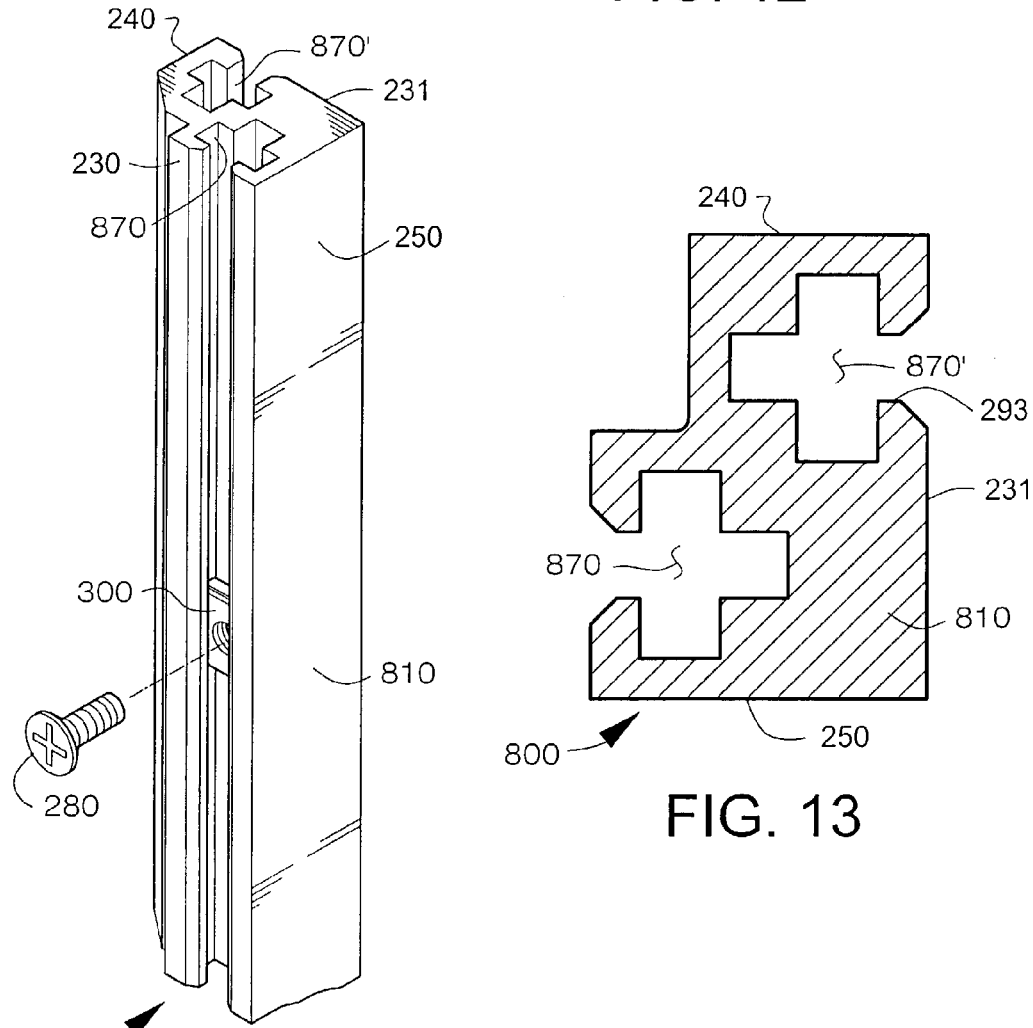
FIG. 12A
FIG. 13

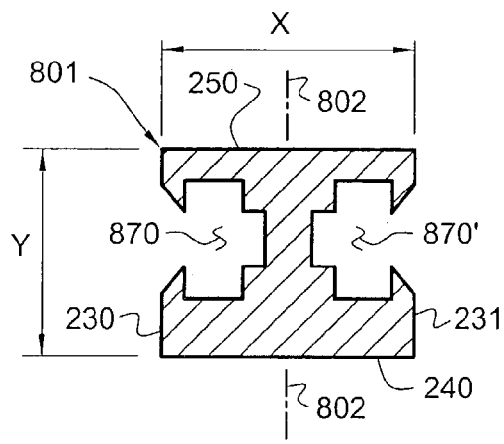
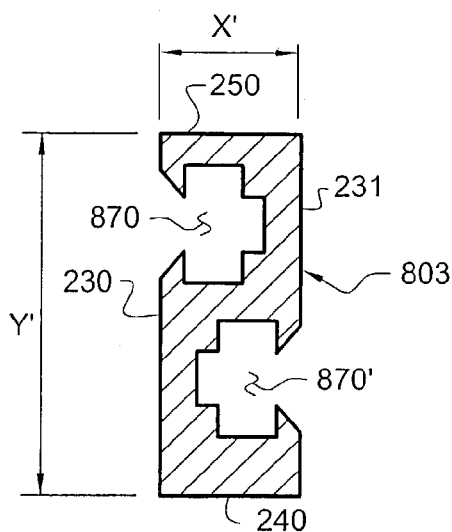
FIG. 13A
FIG. 13C
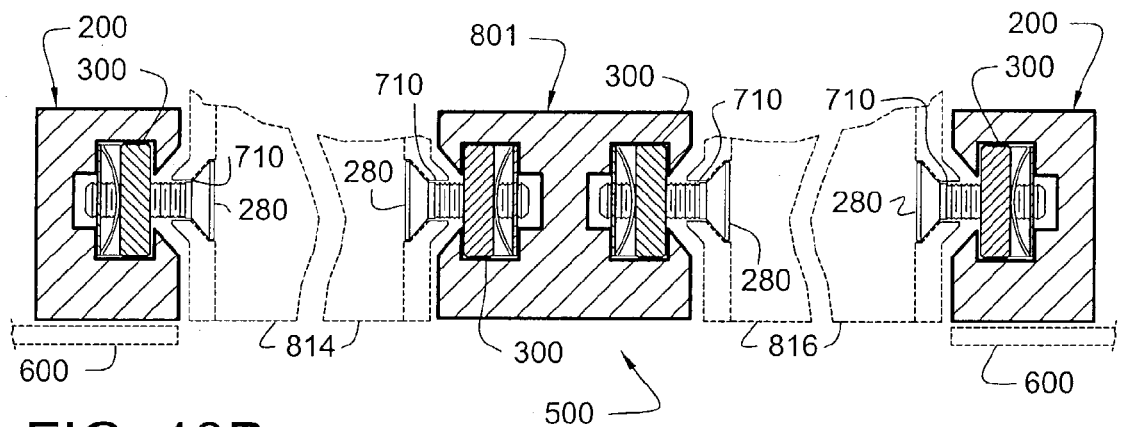
FIG. 13B
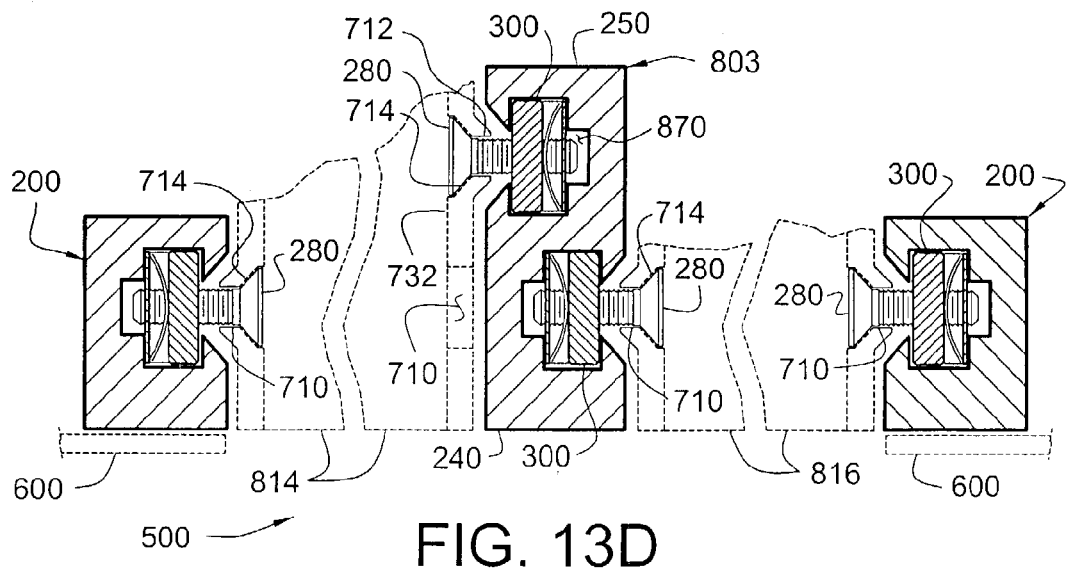
FIG. 13D

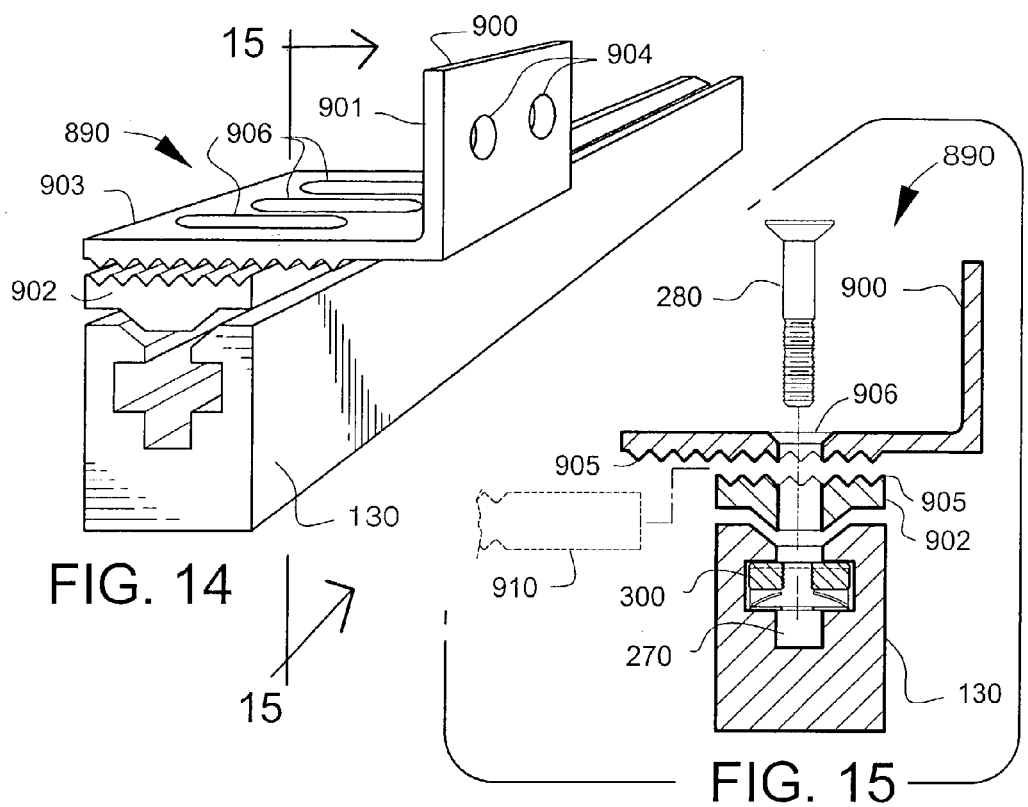
FIG. 14
FIG. 15
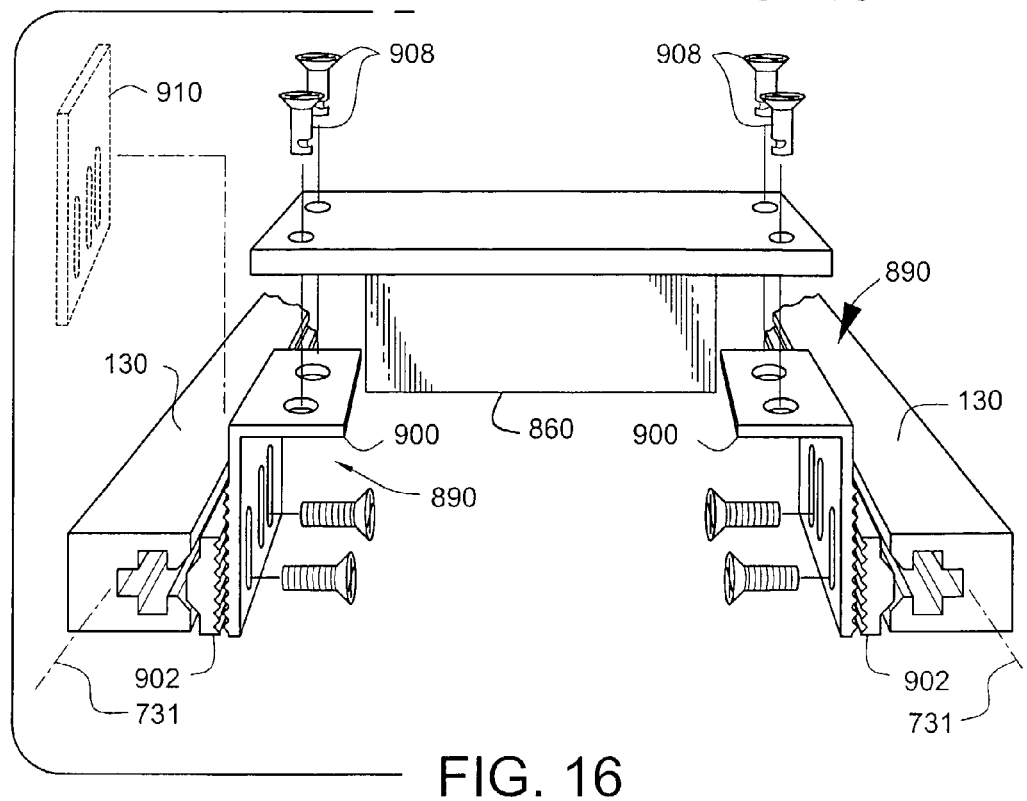
FIG. 16

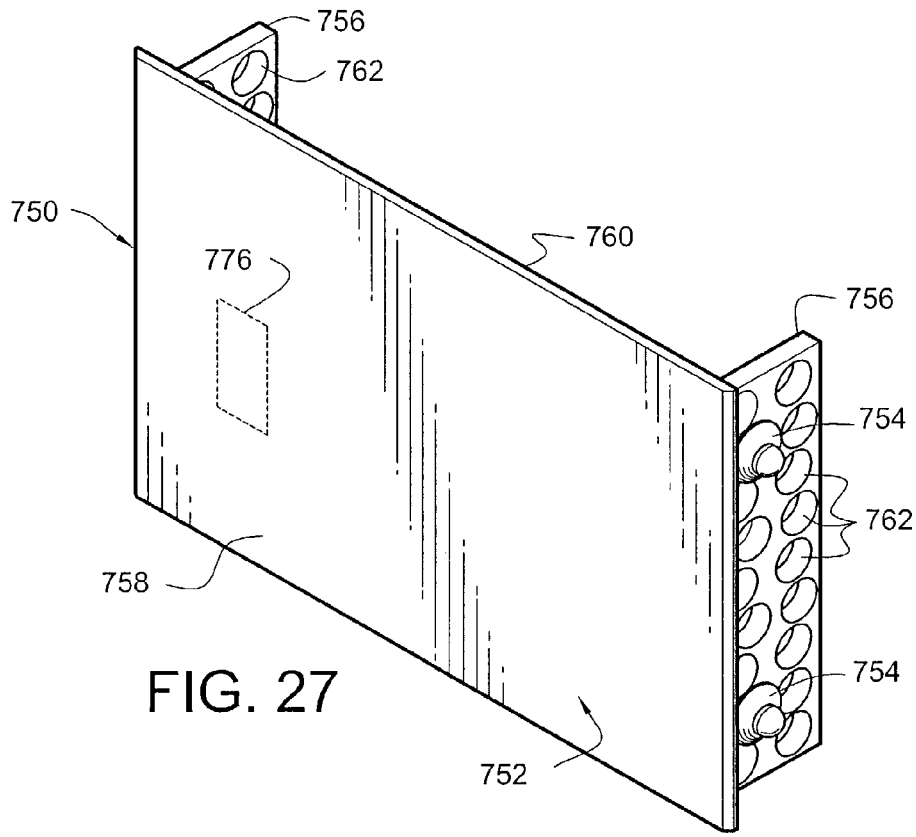
FIG. 27
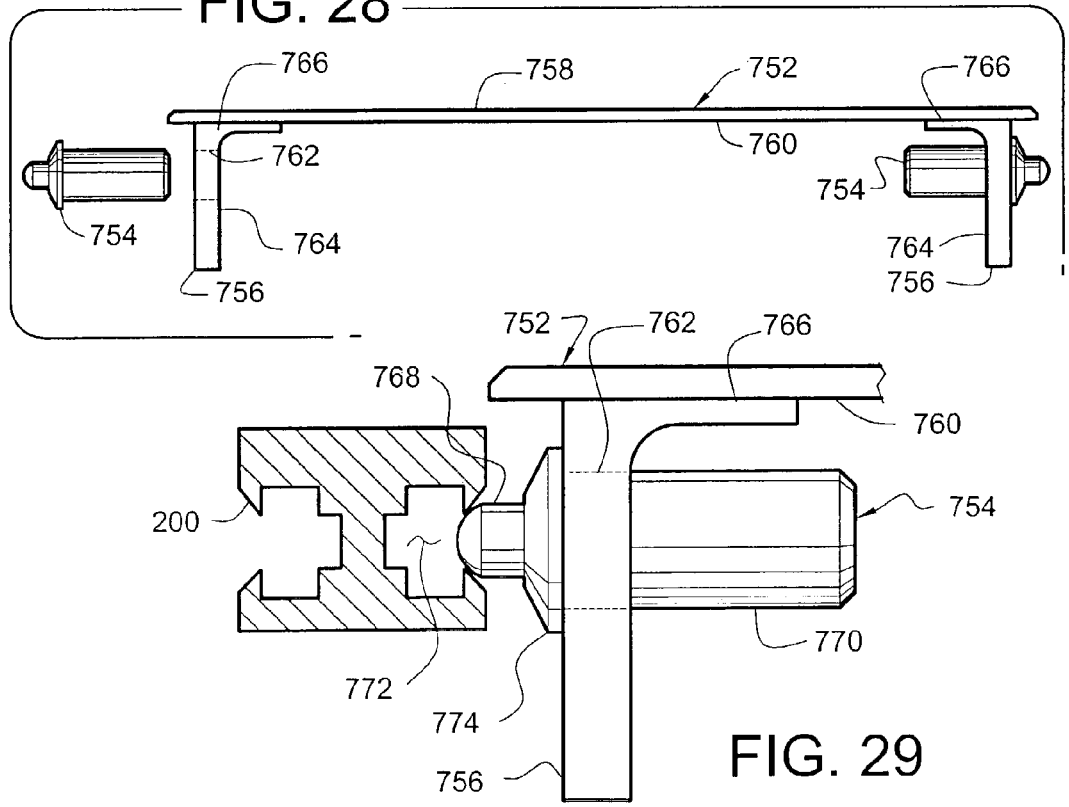
FIG. 28
FIG. 29

METHOD AND SYSTEM FOR MOUNTING RADIO AVIONICS

CROSS-REFERENCE TO RELATED APPLICATIONS

The present application is related to and claims priority from applicant's prior U.S. Provisional Application Ser. No. 60/394,119, filed Jul. 3, 2002, entitled "METHOD AND SYSTEM FOR MOUNTING RADIO AVIONICS", and from applicant's prior U.S. Provisional Application Ser. No. 60/365,482, filed Mar. 18, 2002, entitled "METHOD AND SYSTEM FOR MOUNTING RADIO AVIONICS", the contents of which are herein incorporated by reference and are not admitted to be prior art with respect to the present invention by their mention in this cross-reference section.

BACKGROUND

The present invention relates generally to the installation and mounting of radio avionics in aircraft. The principles of flight are relatively simply thrust creates lift sufficient to overcome gravity and drag. The tools necessary to actually pilot an aircraft are far from simple. Weather may limit visibility, flights may be made at night, and the distance of the flight may be such that it is important to very carefully adhere to the federally-approved airways and altitudes. Unseen in the first early airplanes, radios are now perhaps the most important piece of equipment available to the pilot. Radio communications play an essential part in the piloting of aircraft, including, for example, spacecraft. Typically, aircraft have a multiplicity of radio equipment enabling the pilot to communicate with ground-based control operators, other aircraft, VOR, and the like, to navigate along a flight route and to fly within the Federal Airways of the United States and elsewhere.

It is generally appreciated that advances made in electronics and computer technology are occurring at a rapid pace. It is therefore not surprising that advances are being made in computerization within the cockpits of aircraft as well, including, for example, helicopters. As improved radio avionics equipment is developed, the useful life of existing equipment grows ever shorter. Understandably, pilots and owners of aircraft desire to make use of newer components providing more features and abilities. The terms "general aviation" and "general aviation aircraft" as used herein are expressly intended to include such vehicles as helicopters, commercial aircraft, military aircraft, spacecraft, both small and large aircraft, and similar present and future vehicles requiring avionics support.

The forces applied to an aircraft in its normal operation can be rather severe. It is therefore important that equipment, especially components used in flight and navigation, be properly secured within the structural assembly most commonly identified as the instrument panel. Installation of the radio avionics and similar components has been facilitated by competitive market forces, driving manufacturers to produce components to an unofficial size. More specifically, the unofficial standard of sizing generally is applicable to the width of the component so that it will fit between the supporting rails of the cockpit instrument panel avionics rack. Width is, however, only one dimension; and height and depth are far from standard. In most instances, a mounting tray must first be installed into which the component will be nested and further secured. As used herein, it is understood and appreciated that the term "mounting rack" includes the associated mounting boxes and mounting trays. Mounting trays are typically specifically designed for each given component and cannot accommodate new equipment. The process of upgrading avionics equipment therefore frequently requires the removal of old and the installation of new mounting trays within the mounting rack.

Typically, one or more mounting racks are incorporated within the structure of the instrument panel. Today, these mounting racks comprise vertical mounting rails specifically set for securing the mounting trays. Typically, these rails are initially provided with a set of vertically-repeating oval holes. Under conventional theory, the installer simply places a slip-nut over the rail aligned with the hole so that a screw set through the side of the mounting tray will pass through the oval hole and into the slip nut, thus binding the mounting tray rigidly to the mounting rail. As space is limited in the cockpit, as well as for aesthetic appearances, it is desired to place the mounting trays such that there are no gaps between components. As a result, the mounting holes provided by the manufacturer of the component's mounting tray does not always align with the provided oval holes in the rails. Typically, a considerable amount of grinding and drilling is therefore required by the installer to properly position at least one hole in each rail at the appropriate location required by the mounting tray within the rack. Over time, as new mounting trays are installed for new components with improved functions, the re-drilling and modification of the support rails leads to considerable degradation in the structural integrity of the mounting rails and rack. Breakage, bending, and slipping of the components can result if the rails are modified too extensively. Further, weakened rails may require the addition of unplanned support affixed to the rear of the mounting tray to alleviate stress on the weakened rails.

Thus, a great need exists for a mounting system capable of infinite adjustment and re-usable fasteners that requires no modification, drilling or grinding to accommodate current and future avionics-components mounting trays.

OBJECTS OF THE INVENTION

It is a primary object and feature of this invention to fill the above-mentioned needs. More specifically, it is an object and feature of the present invention to provide a system and method for installing and mounting radio avionics components that is infinitely adjustable and re-usable.

Still another object and feature of the present invention is to provide a system and method that is structurally sound and capable of supporting increasingly heavy avionics components without additional rear support.

A further object and feature of the present invention is to provide a system and method that may be installed and employed easily in a wide variety of general aviation aircraft.

Yet another object and feature of the present invention is to provide a system and method that improves overall structural integrity of the cockpit instrument panel.

Still another object and feature of the present invention is to provide a system and method that may be upgraded if desired without full replacement.

Yet another object and feature of the present invention is to provide a system that accommodates two or more adjacent vertical stacks of avionics components.

An additional object and feature of the present invention is to provide a system that provides user-selected system adjustability.

Additionally, it is an object and feature of the present invention to provide a system compatible with quick-release Dzus-type fasteners.

SUMMARY OF THE INVENTION

In accordance with a preferred embodiment hereof, this invention provides a system for mounting in a general aviation aircraft cockpit instrument panel assembly at least one avionics-components tray having at least one side, at least one mounting hole in the side, and at least one mounting connector for making a connection through the mounting hole, comprising, in combination: supporting means for supporting the avionics-component tray; attaching means for attaching the avionics-component tray to such supporting means; wherein such attaching means comprises receiving means for receiving the at least one mounting connector; sliding means for permitting sliding of such attaching means within such supporting means; wherein such sliding means comprises holding means for slideably holding such attaching means within such supporting means; and connecting means for nonslideably connecting such attaching means within such supporting means when the at least one mounting connector is connected with such receiving means.

In accordance with another preferred embodiment hereof, this invention provides a system for mounting in a general aviation aircraft cockpit instrument panel assembly at least one avionics-components tray having at least one side, at least one mounting hole in the side, and at least one mounting connector for making a connection through the mounting hole, comprising, in combination: at least one support bar, comprising at least one longitudinal axis and at least one first longitudinal face, structured and arranged to support the at least one avionics-component tray; at least one attacher adapted to attach the at least one avionics-component tray to such at least one support bar; wherein such at least one attacher comprises at least one receiver adapted to receive the at least one mounting connector; at least one slide structured and arranged to permit sliding such at least one attacher within such at least one support bar; wherein such at least one slide comprises at least one holder adapted to slideably hold such at least one attacher within such at least one support bar; and at least one connection system structured and arranged to nonslideably connect such at least one attacher within such at least one support bar when the at least one mounting connector is connected with such at least one receiver.

Moreover, it provides such a system wherein such at least one slide comprises at least one T-shaped slot portion, of such at least one support bar, defining at least one continuous slot opening portion within such at least one first longitudinal face of such at least one support bar. Additionally, it provides such a system wherein such at least one support bar further comprises at least on end cap adapted to cap at least one end portion of such at least one T-shaped slot portion. Also, it provides such a system wherein: such at least one support bar comprises at least one additional slot portion adapted to receive at least one mounting connector portion; and such at least one additional slot portion and such at least one T-shaped portion, in combination, comprise at least one plus-shaped slot portion. In addition, it provides such a system wherein each such at least one attacher comprises, in combination: at least one retaining bracket; at least one threaded nut in such retaining bracket; at least one resilient spring in such retaining bracket; wherein such at least one resilient spring is located between such at least one retaining bracket and such at least one nut. And, it provides such a system wherein such holder is structured and arranged so that such spring applies separation force between such at least one retaining bracket and such at least one nut. Further, it provides such a system wherein such support bar is structured and arranged to removably attach to the cockpit instrument panel assembly.

Additionally, it provides such a system wherein such at least one support bar further comprises: at least one substantially rectangular cross section; and at least one second longitudinal face; wherein such at least one second longitudinal face is located parallel to such at least one first longitudinal face. Moreover, it provides such a system wherein: each such at least one support bar further comprises at least two of such at least one T-shaped slot portions; at least one of such at least two T-shaped slot portions defines at least one continuous slot opening portion within such at least one second longitudinal face of such at least one support bar.

Additionally, it provides such a system wherein such at least one continuous slot opening portion comprises at least one countersink receiver adapted to receive at least one countersunk mounting hole of the at least one avionics-component tray. Also, it provides such a system wherein such wherein such at least one support bar further comprises: at least one mountable portion; and at least one mounting extension adapted to extend such at least one mountable portion beyond the substantially rectangular cross section.

In addition, it provides such a system further comprising: at least one quick-release adapter to adapt at least one quick-release connector to such at least one attacher; wherein such at least one quick-release adapter comprises at least one mount, to mount at least one avionics-component compatible with the at least one quick-release connector, in a position adjacent to such at least one support bar, at least one adjuster adapted to permit substantially-transverse positional adjustment of such at least one mount relative to such at least one longitudinal axis of such at least one support bar, and at least one mounting connector to connect such at least one quick-release adapter to such at least one attacher; and wherein such at least one mount comprises at least one quick-release receiver adapted to receive and removably retain the at least one quick-release fastener. And, it provides such a system wherein such at least one quick-release receiver is adapted to receive a Dzus-type mounting connector.

Further, it provides such a system, wherein: such at least one adjuster comprises at least one first interlocker; such at least one mount further comprises at least one second interlocker; such at least one first interlocker and such at least one second interlocker are structured and arranged to firmly interlock; and such at least one first interlocker and such at least one second interlocker, when interlocked, prevent relative movement between such at least one adjuster and such at least one mount. Even further, it provides such a system wherein: at least one portion of such at least one first interlocker comprises at least one first interlocking detent; at least one portion of such at least one second interlocker comprises at least one second interlocking detent; and such first at least one interlocking detents and such second at least one interlocking detents, when meshed, prevent relative movement between such at least one adjuster and such at least one mount; wherein meshing of such said first and such second at least one interlocking detents prevents substantially-transverse positional movement of such at least one mount relative to the longitudinal axis of such at least one support bar.

Moreover, it provides such a system further comprising: at least one spacer adapted to fit between such at least one mount and such at least one adjuster; wherein such at least one spacer permits at least one Dzus-type avionics-component to be mounted in a general aviation aircraft cockpit instrument panel assembly adapted to receive the at least one avionics-components tray.

Additionally, it provides such a system further comprising: at least one tray adjuster structured and arranged to permit positional adjustment of the at least one avionics-component tray relative to such at least one support bar; wherein such at least one tray adjuster comprises, at least one engager adapted to engage at least one portion of the at least one avionics-component tray; at least one cam adjuster structured adapted to adjust the position of such at least one engager; at least one mounting aperture to permit passage of the at least one mounting connector; wherein rotation of such at least one cam adjuster produces at least one substantially-transverse movement, relative to such at least one longitudinal axis of such at least one support bar, of both such at least one engager and the at least one avionics-component tray.

Also, it provides such a system wherein: such at least one engager comprises at least one essentially cylindrical member having at least one central axis, at least one radius and at least one outer circumference; and such at least one cam adjuster comprises such at least one mounting aperture passing through such at least one engager such that such at least one mounting aperture is eccentrically located at a point adjacent to such at least one central axis. In addition, it provides such a system further comprising: at least one avionics-components tray; wherein such at least one avionics-components tray comprises, at least one side, and at least one mounting hole in such at least one side. And, it provides such a system wherein such at least one mounting hole is adapted to receive such at least one essentially cylindrical member. Further, it provides such a system wherein the at least one radius of such at least one essentially cylindrical member is about one-half inch.

Even further, it provides such a system further comprising: at least one blanking cover adapted to cover unused portions of the general aviation aircraft cockpit instrument panel; wherein such at least one blanking cover comprises, at least one filler panel to fill such unused portions, at least one retainer to removably retain such at least one filler panel on such at least one support bar, at least one adjuster to adjust the position of such filler panel relative to the general aviation aircraft cockpit instrument panel.

Moreover, it provides such a system wherein: such at least one filler panel comprises a substantially planar member having at least one front face and at least one rear face; such at least one retainer comprises at least one spring loaded engager adapted to removably engage such at least one support bar; such at least one adjuster comprises at least one retainer holder, firmly coupled to such at least one rear face; and such at least one retainer holder is adapted to adjustably hold such at least one retainer in at least one selected position relative to such at least one front face. Additionally, it provides such a system wherein: such at least one retainer holder comprises a plurality of holding apertures adapted to receive and removably hold such at least one retainer; each one of such plurality of holding apertures is uniquely positioned relative to such at least one filler panel; and at least two of such plurality of holding apertures are arranged to permit at least one matching alignment of at least two of such at least one retainers relative to such at least one front face.

Also, it provides such a system wherein such at least one support bar comprises at least two of such at least one slides. In addition, it provides such a system wherein such at least one support bar further comprises: at least one mountable portion; and at least one mounting extension adapted to extend such at least one mountable portion of such at least one support bar. And, it provides such a system wherein: such at least one support bar comprises at least one contour structured and arranged to match at least one contoured portion of the general aviation aircraft cockpit instrument panel assembly; and such at least one contour permits such at least one support bar to replace at least one sheet metal portion of the general aviation aircraft cockpit instrument panel assembly.

In accordance with another preferred embodiment hereof, this invention provides a method of installing, in a general aviation aircraft cockpit instrument panel assembly, mounting bars for mounting at least one avionics-components tray having at least one side, at least one mounting hole in the side, comprising, in combination, the steps of: removing any existing mounting rails from the cockpit instrument panel assembly; providing at least one mounting bar comprising at least one longitudinal slot portion holding at least one slideably adjustable attacher; sizing such at least one mounting bar to substantially match a length of at least one existing rail; determining locations of mounting screws on such at least one mounting bar using such at least one existing rail as a template; preparing receiving holes at such locations for mounting screws in such at least one mounting bar; placing such at least one slideably adjustable attacher into such at least one longitudinal slot portion; blocking the ends of such at least one longitudinal slot portion to retain such at least one slideably adjustable attacher; and attaching such at least one mounting bar containing such at least one slideably adjustable attacher to the cockpit instrument panel assembly substantially proximate to a location of at least one such removed existing side mounting rail in a position suitable to mount the at least one avionics-components tray.

In accordance with another preferred embodiment hereof, this invention provides a method of installing, in a general aviation aircraft cockpit instrument panel assembly comprising at least one mounting bar having at least one longitudinal slot portion, at least one avionics-components tray having at least one side, at least one mounting hole in the side, comprising, in combination, the steps of: establishing at least one suitable mounting position of the at least one avionics-components tray adjacent to such at least one longitudinal slot portion; and providing within the at least one side of the at least one avionics-components tray at least one new mounting hole, aligning with such at least one longitudinal slot portion, to permit the at least one avionics-components tray to be mounted in the at least one suitable mounting position.

In accordance with another preferred embodiment hereof, this invention provides a method of using, in a general aviation aircraft cockpit instrument panel assembly, side mounting bars for mounting at least one avionics-components tray having at least one side, at least one mounting hole in the side, and at least one mounting connector for making a connection through the mounting hole, comprising in combination, the steps of: accessing at least one mounting bar comprising at least one longitudinal slot portion holding at least one unattached spring loaded slideably adjustable attacher; selecting an unattached one of such at least one unattached spring loaded slideably adjustable attacher; pressing such spring loaded slideably adjustable attacher to release friction between such spring loaded slideably adjustable attacher and such longitudinal slot portion; moving such spring loaded slideably adjustable attacher to a user preferred location within such longitudinal slot portion; and releasing such spring loaded slideably adjustable attacher within such longitudinal slot portion at such user preferred location. Further, it provides such a method further comprising the step of attaching the at least one mounting connector of the at least one avionics-components tray to such at least one spring loaded slideably adjustable attacher. Even further, it provides such a method further comprising the steps of: inserting at least one-tray adjuster through the at least one mounting hole; inserting the at least one mounting connector through such at least one tray adjuster to loosely engage the at least one mounting connector of the at least one avionics-components tray to such at least one spring loaded slideably adjustable attacher; adjusting such at least one tray adjuster to move the at least one avionics-components tray to at least one user preferred position; and tightening the at least one mounting connector to firmly attach the at least one avionics-components tray to such at least one spring loaded slideably adjustable attacher.

BRIEF DESCRIPTION OF THE DRAWINGS

FIG. 3 is a detailed partial perspective view of a preferred rack component embodying the present invention.

FIG. 4 is a cross-sectional view through the section 4—4 of FIG. 5, as shown.

FIG. 5 is a partially-exploded perspective view of a preferred rack component.

FIG. 12 is a schematic illustration of a multiple rack installation utilizing a double support rail mounted within a general aviation aircraft instrumentation panel according to an alternate embodiment of the present invention.

FIG. 12A is a detailed partial perspective view of a preferred double support rail according to the preferred embodiment of FIG. 12.

FIG. 13 is a cross-sectional view, through the section 13—13 of FIG. 12, of the midsection of a preferred multiple rack component.

FIG. 13A is a cross-sectional view, similar to cross-sectional view 13—13, of the midsection of another double support rail according to an alternate preferred embodiment of the present invention.

FIG. 13B is a cross-sectional view, through the section 13'—13' of FIG. 12, showing the midsection of a typical multiple rack installation, illustrating the multiple rack component of FIG. 13A in use.

FIG. 13C is another cross-sectional view, similar to cross-sectional view 13—13, taken along the midsection of another multiple rack component according to an alternate preferred embodiment of the present invention.

FIG. 13D is a cross-sectional view through the section 13'—13' of FIG. 12 through the midsection of a typical multiple rack installation, illustrating the multiple rack component of FIG. 13B in use.

FIG. 14 is a partial perspective view of an adapter assembly according to another preferred embodiment of the present invention.

FIG. 15 is a cross-sectional view through the section 15—15 of FIG. 14 of the midsection of a preferred rack component.

FIG. 16 is a schematic illustration of a typical mounting arrangement of rack components, having an adapter assembly, according to a preferred embodiment of the present invention.

FIG. 27 is a front perspective view illustrating a blanking plate according to a preferred embodiment of the present invention.

FIG. 28 is a top view illustrating the blanking plate according to the embodiment of FIG. 27.

FIG. 29 is a top view, in partial section, illustrating the engagement of the retainer within the mounting rack component according to the embodiment of FIG. 27.

DETAILED DESCRIPTION OF A PREFERRED EMBODIMENT OF THE INVENTION

Figure 1:
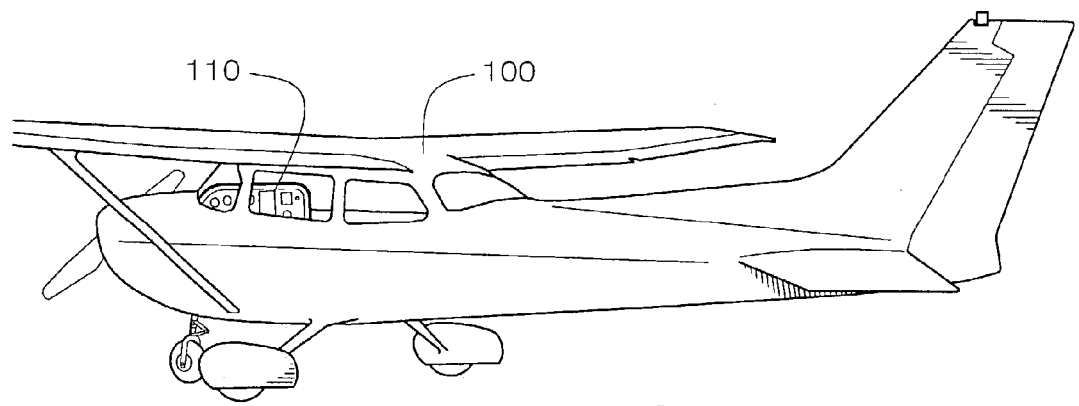
FIG. 1 is an artistic rendering of a general aviation aircraft.

FIG. 1 is an artistic rendering of a general aviation aircraft 100 with a cockpit instrument panel 110.

Figure 2:
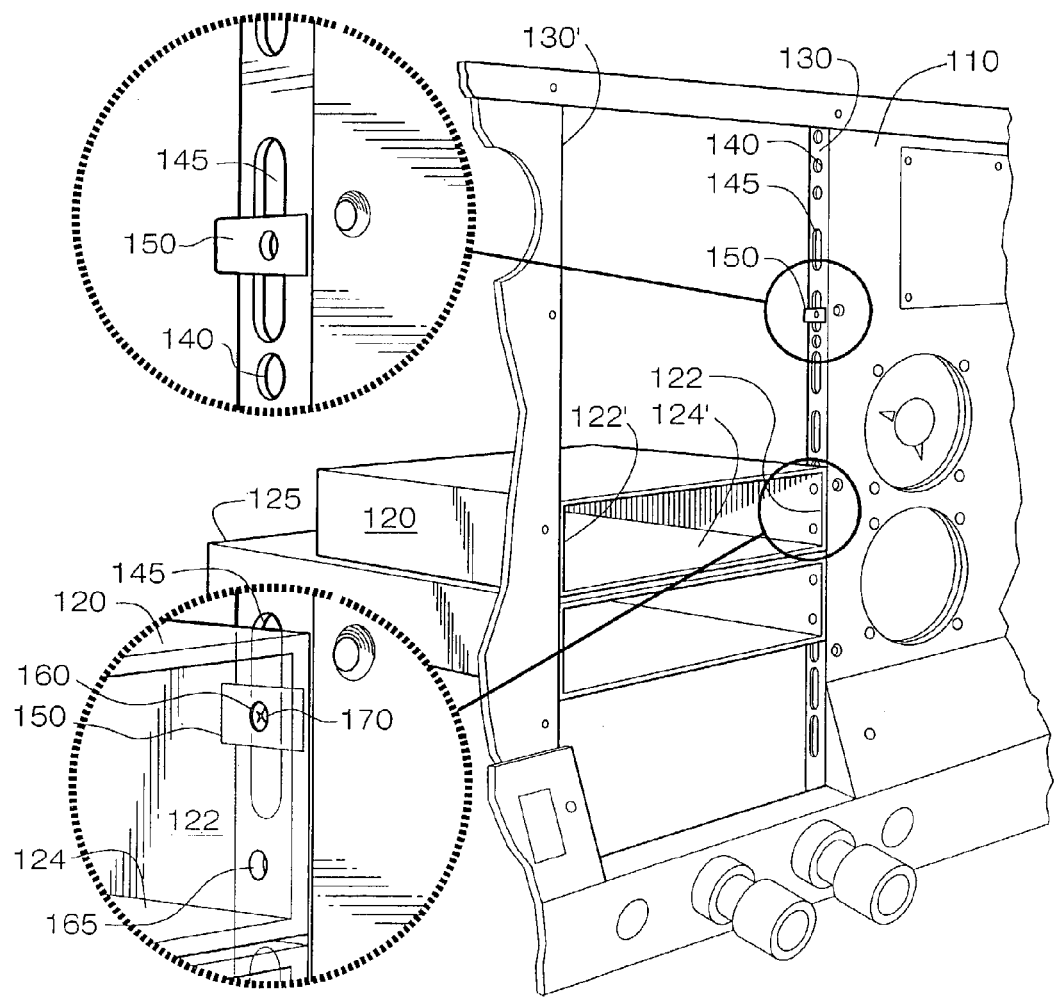
FIG. 2 is a perspective partial view of a general aviation aircraft instrumentation panel illustrating the prior art.

FIG. 2 is a perspective view illustrating a prior art and currently-used system employed for positioning radio avionics-components mounting tray(s) 120 and 125 within a general aviation cockpit instrument panel 110. As shown, right-hand mounting rail 130 has mounting holes 140 and oval mounting holes 145 spaced at intervals throughout the length of rail 130. As shown in the top enlargement, slip nuts 150 are typically placed around rail 130 and proximate to an oval mounting hole 145. As shown in the bottom enlargement, mounting tray 120 is affixed to rail 130 by screw 170 passing through upper attachment screw hole 160 to bind in slip nut 150. Lower attachment screw hole 165 is not proximately located to oval hole 145.

Typically, the avionics components are not directly mounted to the rails 130 and 130'; rather, a mounting tray 120, having a bottom 124 and two parallel sides 122 and 122' with mounting holes 160 and 165 positioned in side 122 substantially proximate to the cockpit panel 110 and open cockpit, is attached to the rails 130 in the proper location. Corresponding holes, not shown due to perspective, located in side 122' are used to attach the mounting tray 120 to rail 122'. When secured, the avionics component is then placed within the affixed tray 120.

To achieve attachment of mounting tray 120, the installer must drill or grind a new hole 140 proximate to the required location of the lower attachment screw hole 165, as shown in the side of mounting tray 120, or omit use of the lower screw hole 165 for attachment of mounting tray 120 to rail 130. Over time, replacement of components and their corresponding mounting tray(s) 120 and 125 will likely lead to multiple custom holes placed in random locations throughout rail 130. Such multiple holes lead to reduced structural integrity of the rail, an undesirable condition for the mounting and support of avionics component mounting tray(s) 120 and 125, as well as an undesirable condition for the overall structural integrity and support of the cockpit instrument panel 110. It is understood that there is a corresponding left-hand mounting rail 130' for securing the left-hand side of mounting tray(s) 120 and 125, with the same features and limitations as discussed in relation to rail 130.

As shown in FIG. 3 and FIG. 4, a preferred embodiment of the present invention is mounting rack component 200, preferably comprised of a bar 210, preferably of aluminum. With respect to FIG. 11, it is observed that the mounting rack component 200 and 200' of the present invention, each comprised of bar 210 and mounting nut assemblies 300 (discussed below), are preferred for mounting and supporting avionics-components mounting rack(s) 690, 692, and 694 (embodying herein at least one support bar structured and arranged to support the avionics-component rack). Together, mounting rack component 200 and 200' preferably comprise a mounting rack system 175, as shown. As shown in FIG. 3, a first channel 220 is set within first surface 230, parallel to sides 240 and 250. A second chapel 260, transverse to and intersecting the first channel 220, is preferably set within the core of bar 210 parallel to first surface 230, as shown. Preferably, the first channel 220 and second channel 260 serve to create a T-shaped-cross-section slot portion 270, wherein second channel 260 serves to hold and permit sliding of a slideable attacher 300, while first channel 220 permits access to the slideable attacher 300 (embodying herein at least one slide structured and arranged to permit sliding the at least one attacher within the at least one support bar, wherein the at least one slide comprises at least one holder structured and arranged to slideably hold the at least one attacher within the at least one support bar).

Under appropriate circumstances wherein the slideable attacher is a nut assembly 300, it may be preferable for the first channel 220 to extend below the second channel 260 so as to accommodate a greater range of lengths of attaching screw 280, which may extend through the nut assembly 300 (embodying herein at least one attacher structured and arranged to attach the avionics-component to the at least one supporting bar). As shown, first channel 220 and second channel 260 together comprise the required T-shaped-cross-section slot portion 270 opening within bar 210 (herein embodying wherein such at least one slide comprises at least one T-shaped slot portion, of such at least one support bar). Most preferably, first channel 220 extends through second channel 260 to form optional additional slot portion 232 (as an addition to portion 270, the same reference number 270 being used whether referring to the entire slot-portion shape or only the "T" portion), thereby accommodating both the mounting nut assembly 300 and varying lengths of attaching screws 280 (herein embodying wherein such at least one support bar comprises at least one additional slot portion adapted to receive at least one mounting connector portion). First channel 220, second channel 260 and additional slot portion 232 together comprise the highly-preferred "plus"-shaped-cross-section slot 270 (herein embodying wherein such at least one additional slot portion and such at least one T-shaped portion, in combination, comprise at least one plus-shaped slot portion), as shown. Preferably, first channel 220 intersects first surface 230 to form a continuous slot opening 292 along first surface 230 (herein embodying at least one continuous slot opening portion within such at least one first longitudinal face of such at least one support bar). Preferably, the first channel 220 is sufficiently deep and wide to accommodate an attachment screw 280. Preferably, the second channel is sufficiently wide and tall to accommodate the mounting nut assembly 300.

FIG. 4 is a cross-sectional view through the section 4—4 of FIG. 5 of the midsection of mounting rack component 200. Preferably, mounting rack component 200 comprises an essentially rectangular cross-section having a preferred length "A" at side 240 and side 250 of about 0.625 inch, and a preferred width "B" at first surface 230 of about 0.575 inch, as shown. Under appropriate circumstances, such as to produce a rail with extended accommodations for various tray mountings, the position of slot 270 may be shifted toward side 250 by a distance of about 0.075 inch.

The exploded view of FIG. 5 shows mounting nut assembly 300 is preferably comprised of retainer 310, nut 320 (preferably square) (embodying herein a receiver structured and arranged to receive the at least one mounting connector), and spring 330. As shown, spring 330 is preferably a spring washer. Preferably, nut 320 is structured and arranged to receive an attachment screw 280, which is commonly used. As shown, retainer 310 preferably has a flat base section 340 defined by two raised ends 350 and 360. For ease of manufacturing, retainer 310 is preferably formed from a flat "U" washer, having the ends of the arms of the "U" and the base of the "U" bent upward to form substantially perpendicular ends 350 and 360. Preferably, the "U" washer is sized such that the remaining flat base is substantially equal to the width of nut 320, and the height of ends 350 and 360 is substantially equal to the height of nut 320. Spring 330 is preferably slightly smaller than the width of nut 320, so that when placed between the flat base 340 of retainer 310 and nut 320, spring 330 does not protrude beyond the edges of nut 320, and spring 330 does not intrude upon threaded hole 325 in nut 320, frustrating or prohibiting passage of a screw 280 through nut 320 (embodying herein at least one retaining bracket; at least one threaded nut in said retaining bracket, at least one resilient spring in said retaining bracket; wherein the at least one resilient spring is between the at least one bracket and the at least one nut).

Under appropriate circumstances and/or in accordance with manufacturing preferences, it is understood that retainer 310 itself may be formed from spring steel or other spring material. Under such appropriate circumstances, base section 340 would preferably be curved to operate as spring 330, more clearly shown in FIG. 6.

Figure 6:
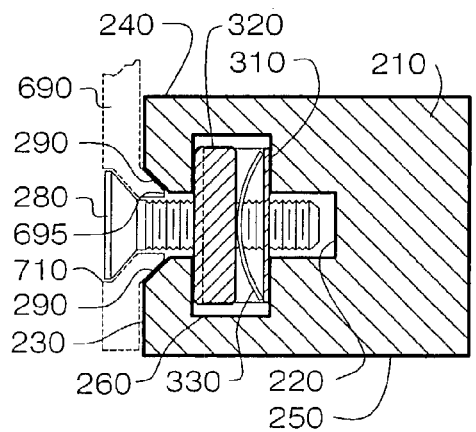
FIG. 6 is a partial cross-sectional view, through the section 6—6 of FIG. 3, of the mounting nut assembly of a preferred rack component.

FIG. 6 provides a cross-sectional view of mounting rack component 200, further illustrating the arrangement of components comprising mounting nut assembly 300. As shown, preferably, spring washer 330 is an expansive spring such that when mounting nut assembly 300 is placed in second channel 260, spring 330 provides sufficient expansion force between retainer 310 and nut 320 to frictionally hold mounting nut assembly 300 within second channel 260 and prevent sliding due to gravity (embodying herein a holder structured and arranged so that the spring applies separation force between the at least one retaining bracket and the at least one nut). Preferably, such friction may be overcome by an installer using screw 280 or other desired implement to overcome the friction hold imparted by spring 330 and slide mounting nut assembly 300 to the desired location in slot 270. Such preferred arrangement allows placement of mounting nut assembly at any point within second channel 260 such that nut 320 may receive an attachment screw through first channel 220. As shown in FIG. 6, it is noted that the preferred binding force imparted by screw 280 securing mounting tray 690 to mounting rack component 200 by securing to nut 320 does not compress or otherwise load spring 330. This is preferred, as it insures spring 330 remains resilient and ready to provide the frictional holding force for mounting nut assembly 300 when and if screw 280 is removed. It is also noted that the binding force imparted by screw 280 securing mounting tray 690 to mounting rack component 200 by securing to nut assembly 300 preferably binds mounting tray 690 firmly against first surface 230, such that mounting tray 690 will not slip or slide (this arrangement embodying herein at least one connection system structured and arranged to non-slideably connect said at least one attacher within said at least one support bar when the at least one mounting connector is connected with said at least one receiver).

As shown in FIG. 4 and FIG. 6, to aid in guiding screw 280 to meet nut 320, and to provide a proper seat for the preferred countersink of screw 280, preferably, edges 290 are angled (herein embodying wherein such at least one continuous slot opening portion comprises at least one countersink receiver adapted to receive at least one countersunk mounting hole of the at least one avionics-component tray). Further, in many instances, mounting hole 710 of mounting tray 690 is formed so as to accommodate screw 280 flush with the interior side wall of mounting tray 690. Often, the exterior portion of the mounting tray 690 is distorted outward in response to providing a dimpled area for screw 280 to nest. As can be seen, the angle 296 preferably accommodates this exterior bump 695 surrounding the exterior of mounting hole 710. Such accommodation is preferred, for such nesting between bump 695 and angles 290 results in improved alignment of the mounting tray 690. Further, as external bump 695 is secured within channel 220 when screw 280 is tightened to secure mounting tray 690 against first surface 230, external bump 695 serves to help lock mounting tray 690 in place and prevent rotation of mounting tray 690 relative to mounting rack component 200.

Mounting nut assemblies 300 are preferably confined to mounting rack component 200 by means of two end caps 400 (herein embodying wherein such at least one support bar further comprises at least on end cap adapted to cap at least one end portion of such at least one T-shaped slot portion). As shown in FIG. 5 and the cross-sectional view of FIG. 7, preferably end cap 400 is comprised from right angle bar 410, cut to a width 450 substantially equal to the width 450 of bar 200. Tongue 420 is substantially equal in width to second channel 260 and is affixed to angle bar 410, preferably by welding. Under appropriate circumstances, casting, milling, gluing, and welding may be used to affix tongue 420 to angle bar 410. As shown in the partial sectional view of FIG. 7, hole 430 in side 460 is aligned with threaded hole 435 in tongue 420 to receive screw 440. When end cap 400 is placed in the end of bar 210 such that tongue 420 is inserted in second channel 260 of slot 270, screw 440, when tightened, provides compression between tongue 420 and side 460, binding end cap 400 to bar 210.

Under appropriate circumstances, it may be desired to use additional mounting nut assemblies 300 tightened in place at either end of mounting rack component 200 in place of end caps 400. The angle 290 of first channel 220 permits screw 280 to bind against first surface 230. Thus, it is to be appreciated that mounting nut assemblies 300 may be left loose within slot 270, or bound in place, even if unattached, at the preference of the installer.

Preferably, in operation, mounting rack component 200 has a plurality of mounting nut assemblies 300, sufficient to enable installation of the desired number of avionics-components mounting trays.

FIG. 8 through FIG. 11 depicts the preferred general steps of installing a preferred embodiment of the mounting rack components 200 in a general aviation aircraft instrument panel 600. As the mounting rack component 200 (a preferred embodiment of the present invention) is intended to replace the existing rail 610, the installer must begin with the removal of the original/current existing rails 610. Preferably, all existing component mounting trays are also removed.

Figure 8:
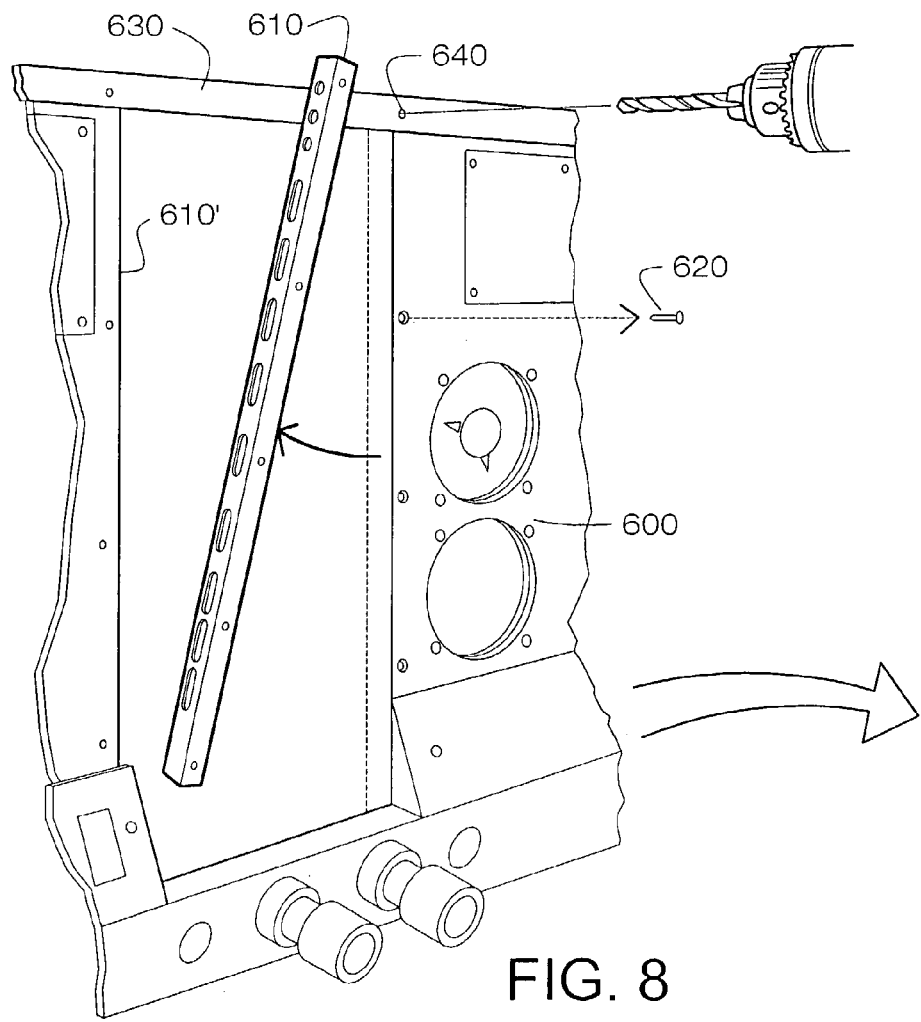
FIG. 8 is a schematic illustration of the removal of original rail components.

As shown in FIG. 8, typically, removal of original rails 610 is accomplished by removing the instrument panel screws 620 securing the instrument panel 600 to the left and right rails 610 and 610'. Further, the rails themselves 610 and 610' are removed from the instrument panel frame assembly 630 (embodying herein the step of removing any existing side mounting rails from the cockpit instrument panel assembly). Typically, the original/current rails are affixed in place by rivets or screws. Removal of original rail 610 from the instrument panel frame assembly 630 may easily be accomplished by removing the fastening screws, or by drilling out the attaching rivets 640 with an appropriately-sized drill bit.

Preferably, mounting rack components 200 are provided in a series of standard pre-cut lengths and with an appropriate number of the preferred mounting nut assemblies 300 (embodying herein the step of providing at least one side mounting bar comprising at least one longitudinal slot holding at least one slideably adjustable attacher). For installation, an installer selects mounting rack components 200 of a length slightly greater than required for his or her general aviation aircraft. Under appropriate circumstances, mounting rack components 200 of specific lengths for specific aircraft may be produced; however, mounting rack components 200 of general lengths may be preferred as a method of limiting aircraft-specific inventory.

Following removal of the left and right original rails 610, the original rails 610 are used as templates to insure proper size and mounting hole location and orientation of a preferred embodiment of the mounting rack component 200. Preferably, each existing rail is placed directly upon a mounting rack component 200 for proper length sizing of the mounting rack component 200, and excess bar 650 is preferably cut for removal from bar 210 (embodying herein the step of sizing the at least one mounting bar to substantially match a length of at least one existing rail). Following such length sizing and cutting, if required, original rail 610 is again used as a template to properly identify instrument panel mounting screw hole 660 placements and mounting holes 670 for attachment of mounting rack component 200 to the instrument panel frame assembly 630 (embodying herein the step of determining locations of mounting screws on such at least one mounting bar using such at least one existing rail as a template). Required holes of a preferably appropriate size are then drilled and tapped, as shown in FIG. 9 (embodying herein the step of preparing receiving holes at such locations for mounting screws in such at least one mounting bar).

Certain general aircraft instrumentation panels may have additional mounting hardware attached to the original rails 610 for connection to the instrument panel 600. Under appropriate circumstances, such additional mounting hardware may be attached to the mounting rack components 200 to effectuate proper support for the instrument panel 600.

Figure 7:
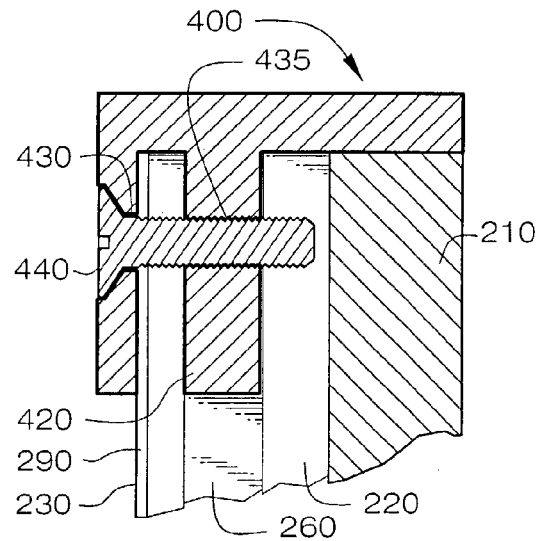
FIG. 7 is a partial cross-sectional view, through the section 7—7 of FIG. 3, of the end of a preferred rack component.
Figure 9:
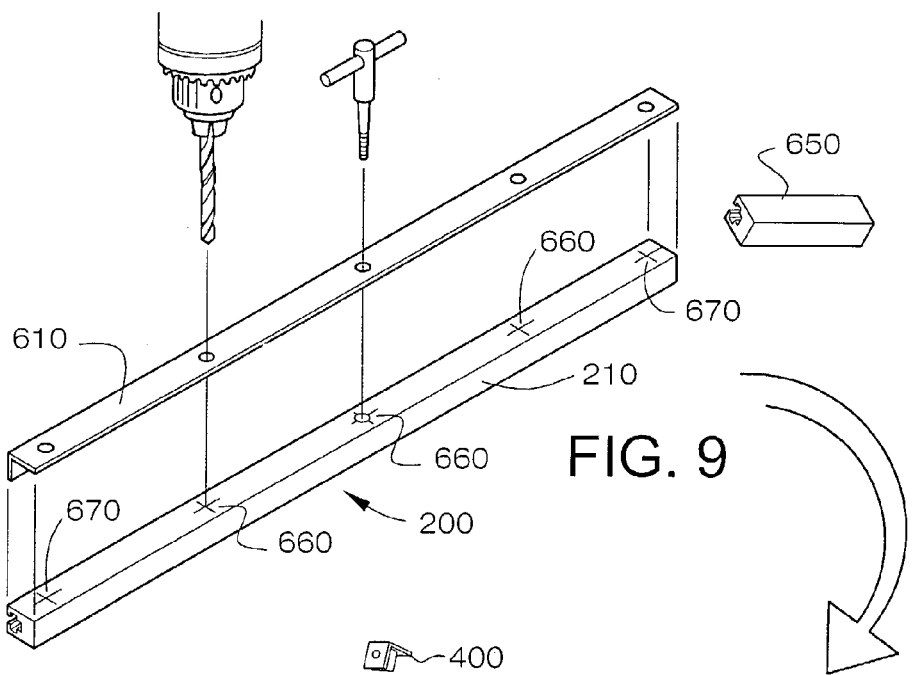
FIG. 9 is a schematic illustration of sizing a preferred rack component to the original rail component.
Figure 10:
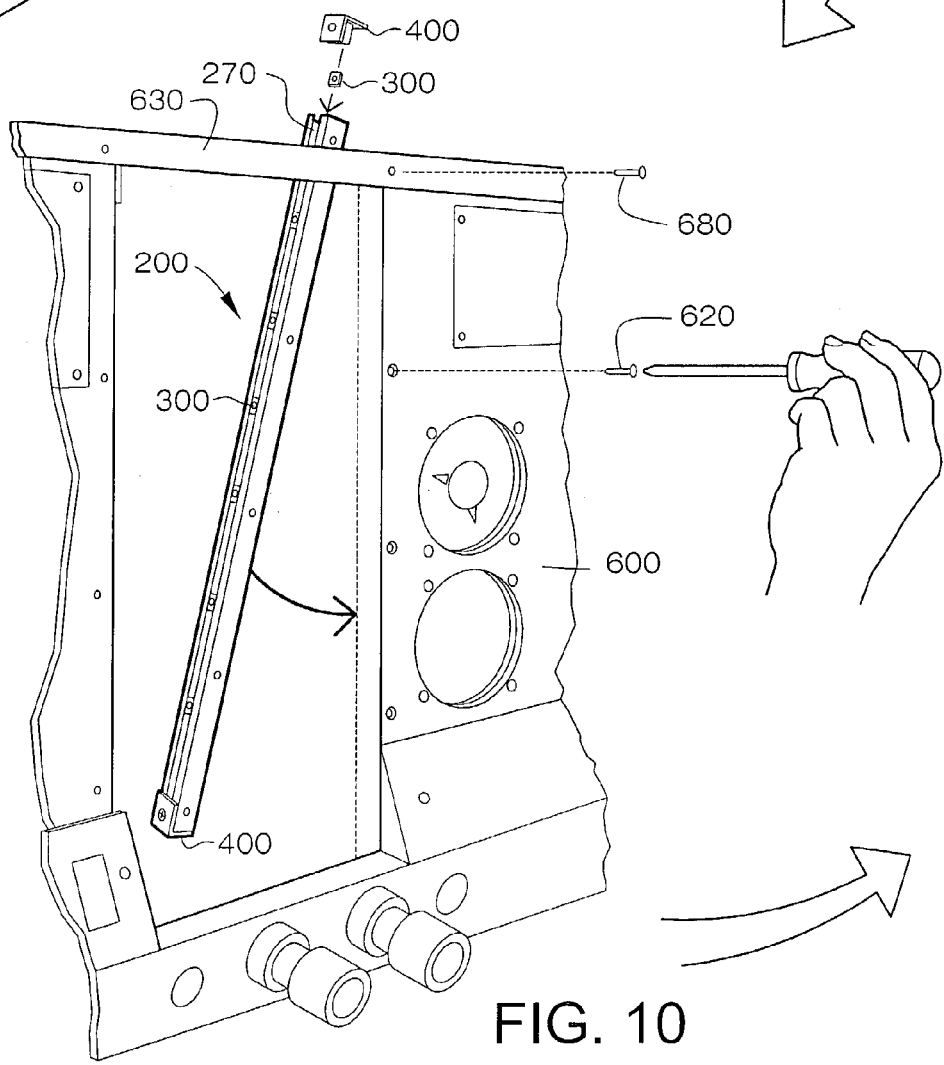
FIG. 10 is a schematic illustration of the installation of a preferred rack component.

As shown in FIG. 9, the installer inserts the preferred number of mounting nut assemblies 300 into slot 270 (embodying herein the step of placing such at least one slideably adjustable attacher into such at least one longitudinal slot). To secure mounting nut assemblies 300 within slot 270, preferably end caps 400, as shown in FIG. 7, are applied to either end of mounting rack component 200 (embodying herein the step of blocking the ends of such at least one longitudinal slot to retain such at least one slideably adjustable attacher). Under appropriate circumstances, the ends may be secured by welding, crimping, or such other activity sufficient to substantially block the ends of slot 270 such that mounting nut assemblies 300 preferably cannot fall out or be lost. Mounting rack component 200 is then placed in the location and position occupied by original rail 610, now removed. Screws 680 are then preferably used to attach mounting rack component 200 to the instrument panel frame assembly 630 in the location previously occupied by original rail 610. Under appropriate circumstances, rivets, welds or other means of attachment to the cockpit frame assembly desired by the installer may be used in place of screws. Screws 620 reattach cockpit instrument panel 600 to mounting rack component 200. This procedure, as depicted for right-hand side mounting rack component 200 is, of course, duplicated for the left-hand side mounting rack component 200. When completed for both, right-and-left-hand-side mounting rack components 200 are properly set to receive and support mounting rack(s) 690, 692, and 694, as shown in FIG. 11 (embodying herein the step of attaching such at least one side mounting bar containing such at least one slideably adjustable attacher to the cockpit instrument panel assembly substantially proximate to a location of at least one such removed existing side mounting rail in a position suitable to mount the at least one avionics-components tray).

Figure 11:
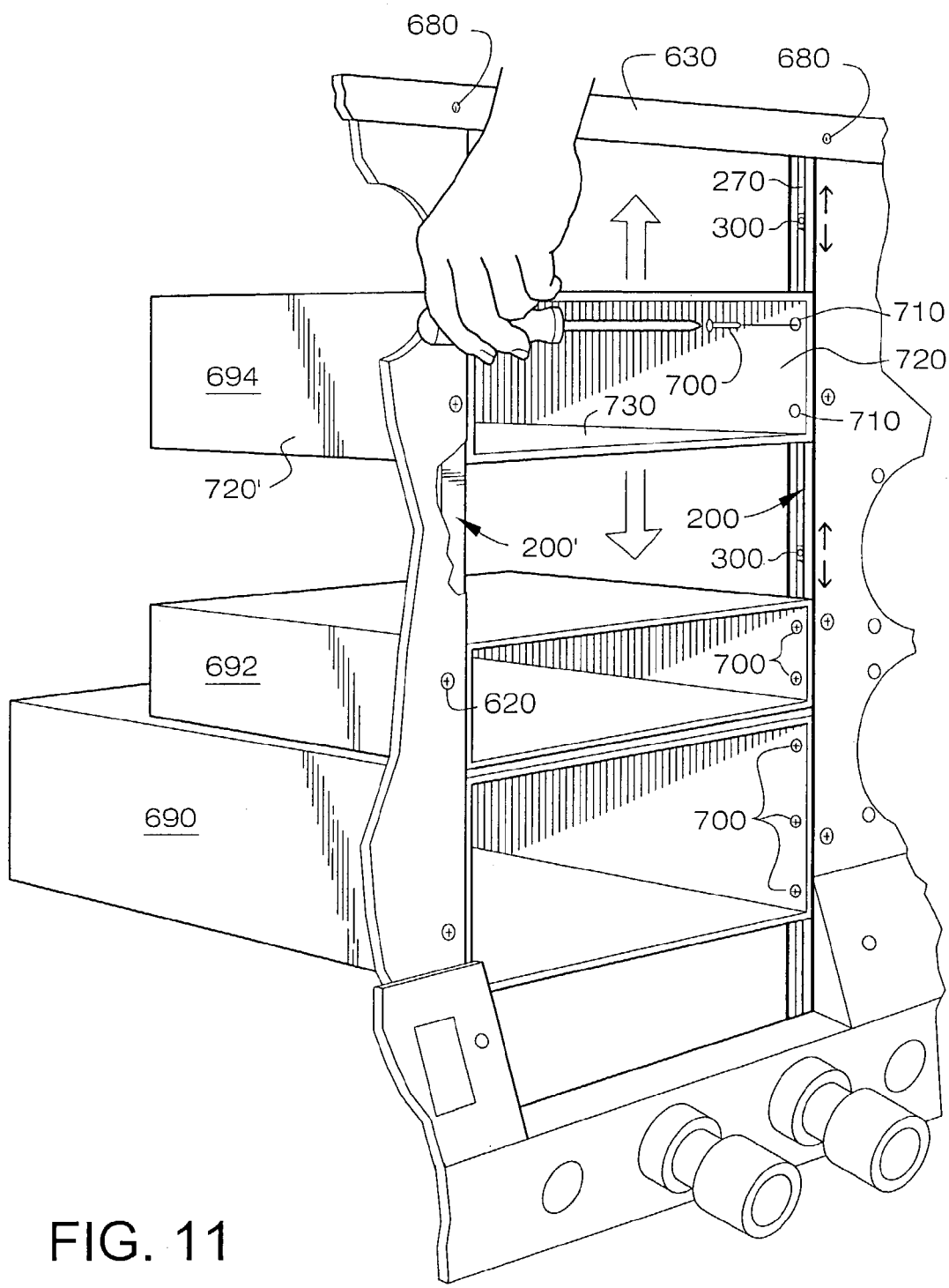
FIG. 11 is a schematic illustration of the using of a preferred rack component.

Mounting tray(s) 690, 692, and 694, appropriate for receiving the desired radio avionics equipment are installed, as shown in FIG. 11. Each mounting tray 690, 692, and 694 is affixed to the corresponding left-and-right-side mounting rack component 200 by screws 700. As shown, the mounting nut assemblies 300 for receiving screws 700 are easily moved to the desired and preferred location where they remain, frictionally-held within slot 270, until engaged by a corresponding screw 700 in the process of attaching a mounting tray 694.

More specifically, preferably, the installer will remove the existing defunct component and its mounting tray so as to have access to the left-and-right mounting rails 300, and the mounting nut assemblies 300 held within slot 270 (embodying herein the step of accessing at least one side mounting bar comprising at least one longitudinal slot holding at least one unattached spring-loaded slideably adjustable attacher).

As described above, the mounting nut assemblies 300 are preferably spring-loaded such that they frictionally hold themselves within slot 270. Preferably, the installer selects an unattached mounting nut assembly 300 (embodying herein the step of selecting an unattached one of the at least one unattached spring-loaded slideably adjustable attacher). By means of a screw, screwdriver, or other suitable device, the installer will press in on the selected mounting nut assembly 300 such that the frictional hold within slot 270 is broken (embodying herein the step of pressing the spring-loaded slideably adjustable attacher to release friction between the spring-loaded slideably adjustable attacher and the longitudinal slot).

While maintaining pressure sufficient to defeat the expansion of the internal spring 330, the installer moves the mounting nut assembly 300 within slot 270 to the preferred location for alignment with the mounting hole in the side of the new mounting tray to be installed (embodying herein the step of moving the spring-loaded slideably adjustable attacher to a user-preferred location within the longitudinal slot). The precise method of determining the location of placement will be determined by the preference of the installer.

Upon determination of the preferred new location for the mounting nut assembly 300, the installer simply releases the pressure he or she has been applying to the mounting nut assembly 300. Preferably, by design, the internal spring 330 described above with respect to FIG. 6, expands to separate the internal components of the nut assembly 300, the nut 320 and retainer 310. Such expansion imparts friction to return between the mounting nut assembly and slot 270 such that, preferably, mounting nut assembly remains fixed in the chosen location (embodying herein the step of releasing the spring-loaded slideably adjustable attacher within the longitudinal slot at such user-preferred location).

As shown in FIG. 11, preferably, mounting tray 694 has a bottom 730, and two parallel sides 720 and 720' with mounting holes 710, as shown, positioned substantially proximate to the cockpit instrument panel 600. Mounting tray 694 is placed between mounting rack components 200 and 200', moved to the desired new location, positioned and mounted securely in place by affixing screw 700 through the side mounting hole 710 of mounting tray 694 and into mounting nut assembly 300 (embodying herein the step of attaching the at least one mounting connector of the at least one avionics-components tray to the at least one spring-loaded slideably adjustable attacher).

Those skilled in the art, upon reading the teachings of this specification, will appreciate that, under appropriate circumstances, general aviation aircraft manufacturers may desire to install a preferred embodiment of the present invention as original equipment manufacture, commonly termed as "OEM". In such circumstances, a preferred embodiment will be present as shown in FIG. 11, and use for mounting tray(s) 690, 692, and 694 will occur as described above.

Future replacement or upgrade of radio avionics equipment is simply accomplished by removing the defunct component and its corresponding mounting tray. Mounting nut assembly(ies) 300 are then preferably realigned in slot 270 to accommodate screw placement, as dictated by the new component mounting tray.

FIG. 12, FIG. 12A, FIG. 13, FIG. 13B, FIG. 13C and FIG. 13D illustrate preferred alternate embodiments of mounting rack system 175 adapted to permit two or more adjacent vertical columns of avionics components to be mounted within a cockpit instrument panel using mounting rack component(s) 200 in combination with double mounting component 800.

FIG. 12 is a schematic illustration of multiple rack installation 500 utilizing double mounting component 800 mounted within instrumentation panel 600, according to an alternate embodiment of the present invention. Many aircraft cockpit designs utilize two or more adjacent vertical columns (or stacks) of avionics components 502, as shown. In this type of side-by-side installation, a single double mounting component 800, located between the two adjacent vertical columns of avionics components 502, is preferably used to simultaneously support one side of both adjacent vertical columns, as shown. Those skilled in the art, upon reading the teachings of this specification, will appreciate that, unless noted otherwise, installation and use of double mounting component 800 is essentially similar to that described for the single channel embodiments of FIG. 8, FIG. 9, FIG. 10 and FIG. 11.

FIG. 12A is a detailed partial perspective view of a preferred double mounting component 800, according to the preferred embodiment of FIG. 12. Preferably, double mounting component 800 comprises a unitary bar 810, preferably of milled or extruded aluminum, having a first surface 230, a second surface 231 (herein embodying at least one second longitudinal face), side 240 and side 250, as shown. Preferably, second surface 231 is essentially parallel to first surface 230, as shown (herein embodying wherein such at least one second longitudinal face is located parallel to such at least one first longitudinal face). Preferably, unitary bar 810 comprises first slot 870, preferably intersecting first surface 230, as shown. Additionally, unitary bar 810 comprises second slot 870' (herein embodying wherein each such at least one support bar further comprises at least two of such at least one T-shaped slot portions), as shown. Preferably, second slot 870' intersects second surface 231 to form a second continuous slot opening 293, as shown (herein embodying wherein at least one of such at least two T-shaped slot portions defines at least one continuous slot opening portion within such at least one second longitudinal face of such at least one support bar). As in the prior described single channel embodiments, first slot 870 and second slot 870' are preferably adapted to accommodate a plurality of mounting nut assemblies 300 and mounting screw(s) 280 of sufficient number to enable installation of the desired avionics-component mounting tray.

FIG. 13 is a cross-sectional view, through the section 13—13 of FIG. 12, of the midsection of double mounting component 800. Preferably, as illustrated in FIG. 13, first slot 870 and second slot 870' are in opposing, approximately orthogonal, orientation to allow for simultaneous mounting of avionics on two opposite sides of double mounting component 800. Preferably, both first slot 870 and second slot 870' comprises the required T-shaped-cross-section slot portion and, most preferably, the "plus"-shaped-cross-section slot portion configuration of slot 270 (described within FIG. 3). First slot 870 and second slot 870' are preferably arranged in overlapping and offset positions to permit side 240 and side 250 to have a relatively narrow width, thereby reducing required width clearances within the instrument panel.

Those skilled in the art, upon reading the teachings of this specification, will appreciate that, under appropriate circumstances, considering such issues as specific aircraft application and configuration, a number of alternate double support rail embodiments are possible within the scope of the present invention (such as those described in the following figures).

FIG. 13A is a cross-sectional view through the section 13—13 of FIG. 12 of the midsection of alternate double mounting component 801 according to an alternate preferred embodiment of the present invention. Preferably, double mounting component 801 is essentially rectangular in cross section and is essentially symmetrical in slot arrangements about centerline 802, as shown. Side 240 and side 250 have a preferred width "X" of about 0.70 inch, as shown. First surface 230 and second surface 231 each comprise a preferred width "Y" of 0.575 inch, as shown. Preferably, first slot 870 and second slot 870' are in opposing, approximately orthogonal, orientation, as shown. Preferably, both first slot 870 and second slot 870' comprise the required T-shaped slot and most preferably the "plus"-shaped cross-section slot configuration of slot 270 (previously described within FIG. 3). As in the prior described embodiments, first slot 870 and second slot 870' are preferably adapted to accommodate a plurality of mounting nut assemblies 300 and mounting screw(s) 280 of sufficient number to enable installation of the desired avionics-component mounting trays.

FIG. 13B is a cross-sectional view through the section 13'—13' of FIG. 12 through the midsection of typical multiple rack installation 500, illustrating double mounting component 801 of FIG. 13A installed within cockpit instrument panel 600, as shown. Preferably, double mounting component 801 simultaneously supports one side of mounting tray 814 and mounting tray 816 (both indicated by dashed lines). In the illustrated example of FIG. 13B, single sided mounting rack component(s) 200 are used to support the sides of mounting tray 814 and mounting tray 816 opposite double mounting component 801, as shown. The preferred symmetrical arrangement of double mounting component 801 closely matches the installed position of the original cockpit instrument panel rails thereby permitting the use of existing side mounting hole(s) 710 within mounting tray 814 and mounting tray 816, as shown.

FIG. 13C is a cross-sectional view (13—13) from FIG. 12 taken along the midsection of an alternate double mounting component 803 according to an alternate preferred embodiment of the present invention. Preferably, double mounting component 803 is essentially rectangular in cross section, as shown. Side 240 and side 250 have a preferred width "X'" of about 0.385 inch, as shown. First surface 230 and second surface 231 each comprise a preferred width "Y'" of 1.00 inch, as shown. Preferably, first slot 870 and second slot 870' are in opposing, approximately orthogonal, orientation, as shown. As in the prior double support rail embodiments, both first slot 870 and second slot 870' comprise the required T-shaped slot and most preferably the "plus"-shaped cross section slot configuration of slot 270, described within FIG. 3. In the embodiment of FIG. 13C, first slot 870 and second slot 870' are preferably stacked thereby providing an efficiently narrow profile at side 240 and side 250, as shown.

Double mounting component 803 is therefore suited for used in cockpit instrument panels having limited rail-to-rail clearances. As in the prior described embodiments, first slot 870 and second slot 870' are preferably adapted to accommodate a plurality of mounting nut assemblies 300 and mounting screw(s) 280 of sufficient number to enable installation of the desired avionics-component mounting trays.

FIG. 13D is a cross-sectional view (13'—13') taken from FIG. 12, through the midsection of another preferred typical multiple rack installation 500, illustrating double mounting component 803 of FIG. 13C installed within cockpit instrument panel 600, as shown. Preferably, double mounting component 803 simultaneously supports one side of mounting tray 814 and mounting tray 816 (both indicated by dashed lines), as shown. Although the standard mounting tray 816 is readily attachable to double mounting component 803 without modification, the preferred asymmetrical arrangement of double mounting component 803 requires that one or more new mounting hole(s) 712 be made in side 732 of mounting tray 814 to accommodate the alternate mounting position of mounting nut assembly 300 within first slot 870, as shown. Mounting tray 814 is preferably modified by establishing a suitable mounting position for mounting tray 814 adjacent to double mounting component 803 with the installed location of first slot 870 measured and marked on the adjacent side 732 of mounting tray 814. New mounting hole(s) 712 are then formed in side 732 using an appropriate drill or punch (herein embodying the steps of establishing at least one suitable mounting position of the at least one avionics-components tray adjacent to such at least one longitudinal slot portion and providing within the at least one side of the at least one avionics-components tray at least one new mounting hole, aligning with such at least one longitudinal slot portion, to permit the at least one avionics-components tray to be mounted in the at least one suitable mounting position).

It is preferred that, both new mounting hole(s) 712 and existing mounting hole(s) 710 comprise a countersunk screw receiver 714 to permit the flush installation of screw(s) 280 and to provide additional stability to mounting tray 814 and mounting tray 816. In some applications, removal of the existing countersunk screw receiver at existing mounting hole 710 may be required to properly fit mounting tray 814 between double mounting component 803 and outer mounting rack component 200, as shown.

FIG. 14 is a partial perspective view of an adapter assembly 890 according to another preferred embodiment of the present invention (herein embodying at least one quick-release adapter to adapt at least one quick-release connector to such at least one attacher). A number of aviation instrumentation applications preferably utilize a system of quick-release fasteners, commonly known as one-quarter turn, or Dzus-type fasteners. Dzus-type fasteners typically comprise a rotatable stud having a spiral cam which engages on to a spring or receptacle mounted permanently on the equipment frame or support. Dzus-type fasteners are favored in applications requiring frequent component fitting and/or service for the reason that the fasteners are engaged or released with relatively small rotational movements, typically, about one quarter turn. FIG. 14 shows a typical arrangement comprising at least one preferred angle adapter 900 (herein embodying at least one mount, to mount at least one avionics-component compatible with the at least one quick-release connector, in a position adjacent to such at least one support bar) engaging at least one support rail adapter 902 (herein embodying at least one adjuster adapted to permit substantially-transverse positional adjustment of such at least one mount relative to such at least one longitudinal axis of such at least one support bar) further engaging mounting rail 130. Both angle adapter 900 and support rail adapter 902 preferably comprise at least one lightweight cast or extruded metal, preferably aluminum, however, those skilled in the art, upon reading the teachings of this specification, will appreciate that, under appropriate circumstances, considering such issues as aircraft application and cost, other materials, such as steel, titanium or rigid plastics, may suffice. Preferably, angle adapter 900 comprises a short angle leg 901 having at least one, preferably two, Dzus receptacles 904 (herein embodying wherein such at least one mount comprises at least one quick-release receiver adapted to receive and removably retain the at least one quick-release fastener and further herein embodying wherein such at least one quick-release receiver is adapted to receive a Dzus-type mounting connector) and a long angle leg 903 having at least one, preferably three, slotted mounting holes 906, as shown.

FIG. 15 is cross-sectional view of 15—15 according to FIG. 14 of the midsection of a preferred rack component. Preferably, angle adapter 900 and support rail adapter 902 further comprise at least one opposing set of linearly positioned teeth 905 (herein embodying wherein at least one portion of such at least one first interlocker comprises at least one first interlocking detent and at least one portion of such at least one second interlocker comprises at least one second interlocking detent) that, when meshed, prevents movement of angle adapter 900 relative to support rail adapter 902 (herein embodying wherein such at least one adjuster comprises at least one first interlocker, such at least one mount further comprises at least one second interlocker, such at least one first interlocker and such at least one second interlocker are structured and arranged to firmly interlock and such at least one first interlocker, and such at least one second interlocker, when interlocked, prevent relative movement between such at least one adjuster and such at least one mount). At least one, preferably two, screw(s) 280 (herein embodying at least one mounting connector to connect such at least one quick-release adapter to such at least one attacher) pass through the slotted mounting holes 906 of angle adapter 900 and further pass through at least one, preferably two, mounting screw holes in support rail adapter 902, as shown. Preferably, mounting rail 130 accommodates a plurality of mounting nut assemblies 300 (located within slot 270) to receive and retain screw(s) 280, as shown. Under appropriate circumstances, where mounting 5.75 inch wide Dzus mount equipment within a standard 6.25 inch wide avionic rack is preferred, rack spacer 910 is preferably used to increase the width of adapter assembly 890 (herein embodying at least one spacer adapted to fit between such at least one mount and such at least one adjuster, wherein such at least one spacer permits at least one Dzus-type avionics-component to be mounted in a general aviation aircraft cockpit instrument panel assembly adapted to receive the at least one avionics-components tray). Preferably, spacer 910 is installed between support rail adapter 902 and angle adapter 900. Preferably, spacer 910 is fully adjustable for proper alignment with the installed tray mount avionics.

FIG. 16 is a schematic illustration of a typical mounting arrangement of rack components, having adapter assembly 890, according to a preferred embodiment of the present invention. In operation, adapter assembly 890 is adjustable for vertical position along mounting rail 130, as well as for transverse positional adjustment relative to the longitudinal axis 731 of mounting rail 130, as shown. Preferably, Dzus compatible avionic equipment 860 may be mounted to adapter assembly 890 using one or more Dzus type fasteners 908, as shown. Angle adapter 900 and support rail adapter 902 may be of varying widths and lengths to accommodate specific installation requirements. It should be noted that the inherent adjustability of adapter assembly 890 permits full compatibility with double mounting component(s) 800, 801, 802 and 803 shown in FIG. 12 through FIG. 13D.

Figure 17:
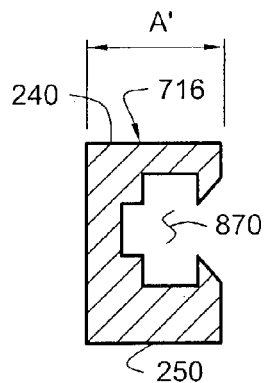
FIG. 17 is a cross-sectional view, similar to cross-sectional view 4—4 of FIG. 5, through the midsection of another rack component according to an alternate embodiment of the present invention.

FIG. 17 is a cross-sectional view similar to cross-sectional view 4—4 taken from FIG. 5 through the midsection of alternate mounting rack component 716 according to an alternate embodiment of the present invention. Mounting rack component 716 preferably comprises a configuration essentially identical to that of mounting rack component 200 with the following exception; both side 240 and side 250 preferably comprise a smaller width "A'" measuring about 0.385 inch. This reduced width preferably permits mounting rack component 716 to be installed in cockpit instrument panels having reduced clearances. Additionally, mounting rack component 716 provides a lightweight alternative to mounting rack component 200 in installations where low aircraft weight is of concern. As in the prior described embodiments, first slot 870 is preferably adapted to accommodate a plurality of mounting nut assemblies 300 and mounting screw(s) 280 (see FIG. 6) of sufficient number to enable installation of the desired avionics-component mounting trays.

Figure 18:
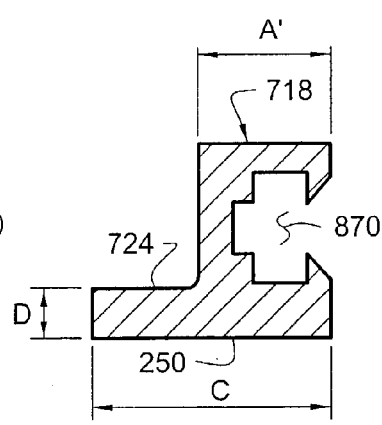
FIG. 18 is a cross-sectional view, similar to cross-sectional view 4—4 of FIG. 5, through the midsection of another rack component according to an alternate embodiment of the present invention.

FIG. 18 is a cross-sectional view similar to cross-sectional view 4—4 of FIG. 3 through the midsection of alternate mounting rack component 718 according to an alternate embodiment of the present invention. Preferably, mounting rack component 718 comprises a configuration essentially identical to that of mounting rack component 716 with the following exception; side 250 comprises an increased width "C" of about 0.700 inch to form mounting extension 724 (herein embodying at least one mountable portion; and at least one mounting extension adapted to extend such at least one mountable portion of such at least one support bar and herein embodying at least one mountable portion; and at least one mounting extension adapted to extend such at least one mountable portion beyond the substantially rectangular cross section), as shown. Preferably, mounting extension 724 provides a greater surface area to side 250 to facilitate the installation and mounting of required cockpit panel elements. Mounting extension 724 preferably comprises a preferred thickness "D" of about 0.150 inch, as shown. Those skilled in the art, upon reading the teachings of this specification, will appreciate that, under appropriate circumstances, considering such issues as cockpit panel arrangements and aircraft type, portions of mounting extension 724 may be removed to accommodate specific installation requirements. As in the prior described embodiments, first slot 870 is preferably adapted to accommodate a plurality of mounting nut assemblies 300 and mounting screw(s) 280 (see FIG. 6) of sufficient number to enable installation of the desired avionics-component mounting trays.

Figure 19:
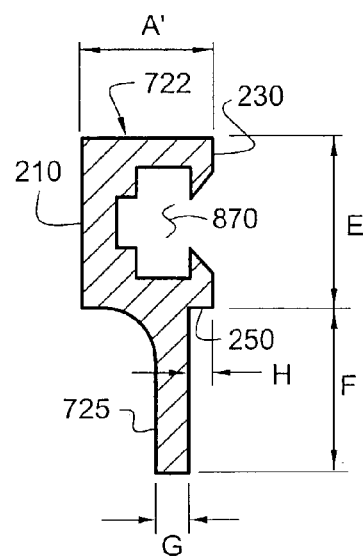
FIG. 19 is a cross-sectional view, similar to cross-sectional view 4—4 of FIG. 5, through the midsection of another rack component according to an alternate embodiment of the present invention.

FIG. 19 is a cross-sectional view similar to cross-sectional view 4—4 of FIG. 3 through the midsection of alternate mounting rack component 722 according to an alternate embodiment of the present invention. Preferably, mounting rack component 722 comprises a configuration essentially identical to that of mounting rack component 716 with the following exceptions; first surface 230 comprises a preferred width "E" of about 0.500 inch and a mounting extension 725 (herein embodying at least one mountable portion; and at least one mounting extension adapted to extend such at least one mountable portion of such at least one support bar and herein embodying at least one mountable portion; and at least one mounting extension adapted to extend such at least one mountable portion beyond the substantially rectangular cross section), projects from side 250, as shown. Preferably, mounting extension 725 has an orientation essentially parallel to first surface 230 as shown. Preferably, length "F" of mounting extension 725 is about 0.500 inch, as shown. Preferably, thickness "G" of mounting extension 725 is about 0.100 inch. Preferably, mounting extension 725 is offset from first surface 230 distance "H" of about 0.080 inch, as shown. The unique arrangement of mounting extension 725 permits mounting rack component 722 to be used in aircraft having pedestal style cockpit instrument panels (as, for example, in aircraft made by the Cirrus Design Corporation of Duluth, Minn., U.S.A.). As in the prior described embodiments, first slot 870 is preferably adapted to accommodate a plurality of mounting nut assemblies 300 and mounting screw(s) 280 (see FIG. 6) of sufficient number to enable installation of the desired avionics-component mounting trays. Those skilled in the art, upon reading the teachings of this specification, will appreciate that, under appropriate circumstances, considering such issues as alternate pedestal style instrument panel configuration and aircraft type, other sizes and orientations of mounting extensions 724 and 725 may suffice.

Further, those skilled in the art, upon reading the teachings of this specification, will appreciate that, under appropriate circumstances, considering such issues as unique aircraft configurations, specialized and or new aircraft designs, combinations of the various above described embodiments of mounting rack component 200 may be used to assemble mounting rack system 175 and multiple rack installation 500.

Figure 20:
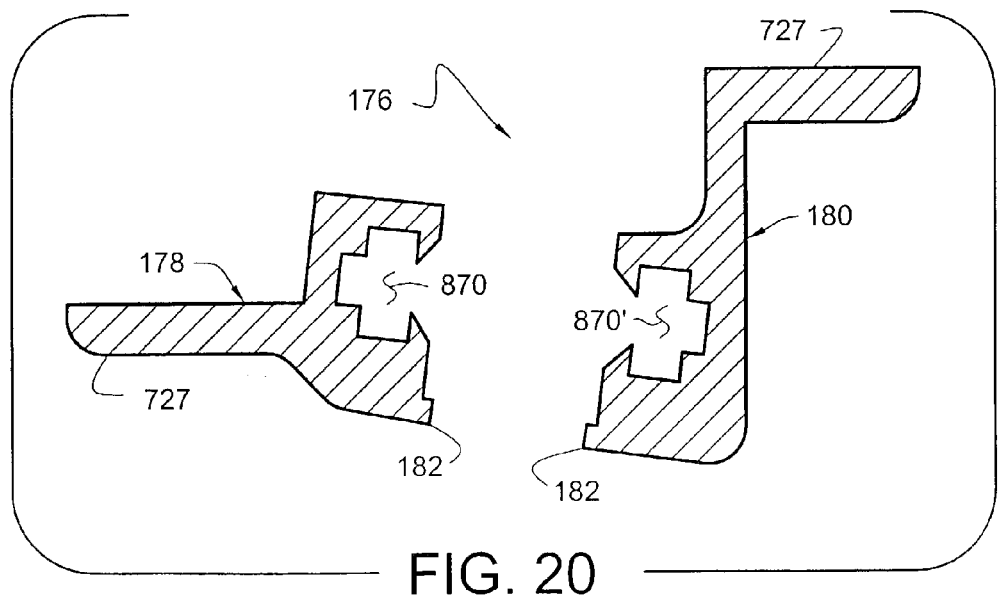
FIG. 20 is a cross-sectional view through the midsections of an alternate set of rack components according to another embodiment of the present invention.

FIG. 20 is a cross-sectional view through the midsections of an alternate embodiment of mounting rack system 175 utilizing aircraft specific mounting rack components 176 according to another preferred embodiment of the present invention. Preferably, mounting rack system 175 is generally adaptable to a number of aircraft models and instrument panel types, however, it is sometimes preferred that a specific mounting rack component combination be developed to fit a specific aircraft configuration. FIG. 20 illustrates one preferred embodiment specifically designed for a single aircraft or range of aircraft having a unique but related instrument panel configuration. In the example of FIG. 20, aircraft specific mounting rack components 176 are arrange to fit within the canted instrument panel of a Beechcraft "Bonanza" or "Baron" (as produced by the Raytheon Aircraft Corporation Lexington, Mass., U.S.A.). Preferably, aircraft-specific mounting rack components 176 comprises left mounting rack component 178 and complementary right mounting rack component 180, as shown. Left mounting rack component 178 preferably comprises first slot 870, as shown. Similarly, right mounting rack component 180 preferably comprises second slot 870', as shown. Both left mounting rack component 178 and right mounting rack component 180 preferably comprise mounting extension(s) 727 adapted to provide appropriate points of mounting to the existing cockpit instrument panel structure (herein embodying at least one mountable portion; and at least one mounting extension adapted to extend such at least one mountable portion of such at least one support bar). In the Beechcraft "Bonanza" or "Baron" aircraft portions of the OEM instrument panel sheet metal are formed to produce an instrument orientation "canted" toward the pilot. Preferably, aircraft specific mounting rack components 176 comprises a similar contoured profile thereby permitting aircraft specific mounting rack components 176 to replace some or all of the OEM instrument panel sheet metal (herein embodying wherein such at least one support bar comprises at least one contour structured and arranged to match at least one contoured portion of the general aviation aircraft cockpit instrument panel assembly and such at least one contour permits such at least one support bar to replace at least one sheet metal portion of the general aviation aircraft cockpit instrument panel assembly). Under appropriate circumstances, both left mounting rack component 178 and right mounting rack component 180 may preferably comprise such OEM sheet metal replacement accommodations as lip 182 adapted to permit aircraft specific mounting rack components 176 to provide a flush and finished appearance to the final avionics installation. Those skilled in the art, upon reading the teachings of this specification, will appreciate that, under appropriate circumstances, such as in the development of future aircraft; additional alternate aircraft specific embodiments are within the scope of the present invention. As in the prior described embodiments, first slot 870 and second slot 870' are preferably adapted to accommodate a plurality of mounting nut assemblies 300 and mounting screw(s) 280 (see FIG. 6) of sufficient number to enable installation of the desired avionics-component mounting trays.

Those skilled in the art, upon reading the teachings of this specification, will appreciate that, installation and use of aircraft specific mounting rack components 176 is essentially similar to that described for the single channel embodiments of FIG. 8, FIG. 9, FIG. 10 and FIG. 11. It is further understood that variations exist in the configurations of all manufactured aircraft and that accommodations required to install the embodiments described herein are within the abilities of those skilled in the art of aircraft design, operation and maintenance.

Figure 21:
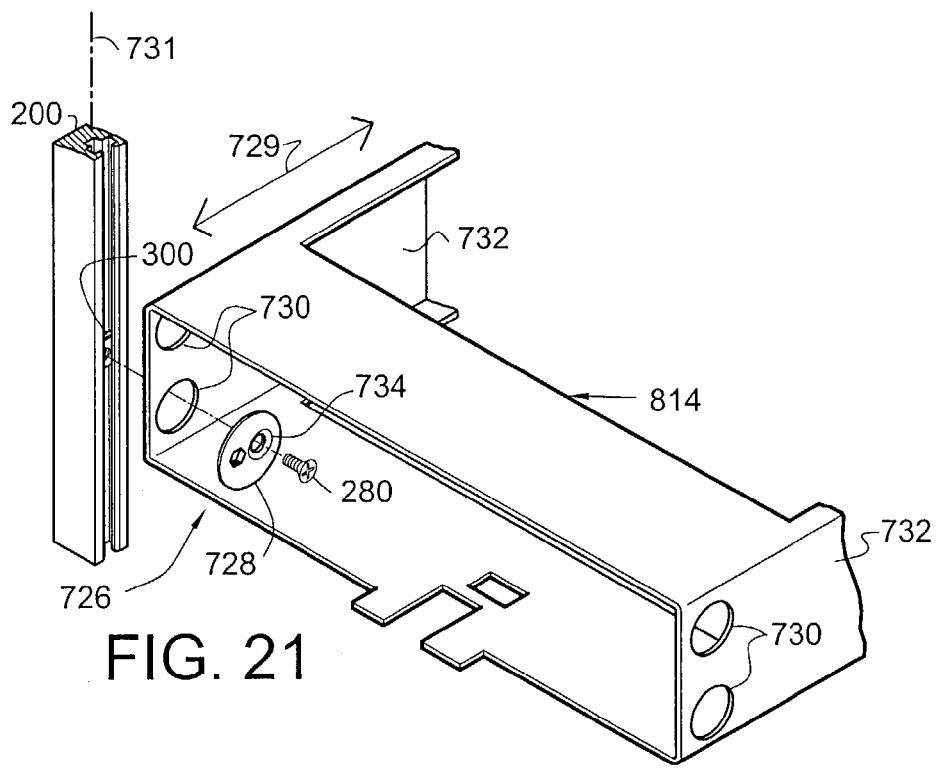
FIG. 21 is an exploded view, partially in section, illustrating an adjustable cam mounting assembly according to a preferred embodiment of the present invention.

FIG. 21 is an exploded view, partially in section, illustrating adjustable cam mounting assembly 726 according to a preferred embodiment of the present invention. The preferred use of cam mounting assembly 726 facilitates the final installation and proper alignment of mounting tray 814 by permitting transverse positional movement 729 of mounting tray 814 with respect to the longitudinal axis 731 of mounting rack component 200, as shown. Typical variations in the design and construction of mounting trays are accommodated by the preferred use of cam mounting assembly 726, permitting the installer to provide a secure and finished appearance to the final avionics installation. Preferably, cam mounting assembly 726 (herein embodying at least one tray adjuster structured and arranged to permit positional adjustment of the at least one avionics-component tray relative to such at least one support bar) comprises mounting aperture 734 and mounting hole 730 located in side 732 of mounting tray 814, as shown. Preferably, mounting tray 814 is assembled to mounting rack component 200 by engaging tray cam insert 728 within mounting hole 730 followed by passing screw 280 through mounting aperture 734 to loosely engage mounting nut assembly 300, as shown. Rotation of tray cam insert 728, while so engaged, provides transverse positional movement 729 of mounting tray 814 with respect to the longitudinal axis 731 of mounting rack component 200 (as further described in FIG. 23).

Figure 22:
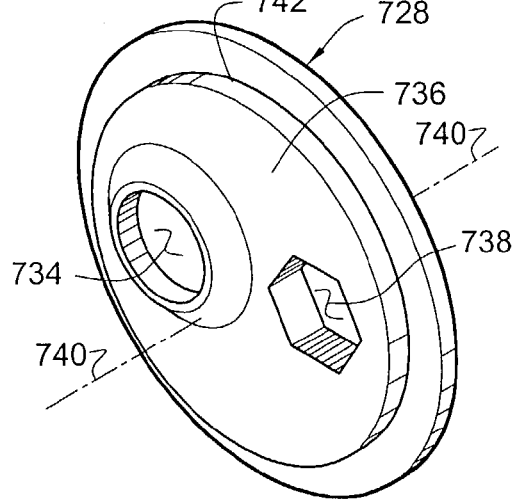
FIG. 22 is a rear perspective view of the tray cam insert according to the embodiment of FIG. 21.

FIG. 22 is a rear perspective view of tray cam insert 728 according to the embodiment of FIG. 21. Preferably, tray cam insert 728 comprises an essentially planar disk having center axis 740, as shown. Tray cam insert 728 further preferably comprises engaging portion 736 (herein embodying at least one engager adapted to engage at least one portion of the at least one avionics-component tray), mounting aperture 734 (herein embodying at least one mounting aperture to permit passage of the at least one mounting connector) and hex aperture 738, as shown. Preferably, engaging portion 736 comprises outer circumference 742 and as a subcomponent, shares center axis 740 with tray cam insert 728, as shown. Preferably, mounting aperture 734 is eccentrically located with respect to center axis 740, passing through engaging portion 736 at a point adjacent to center axis 740, as shown (herein embodying wherein such at least one engager comprises at least one essentially cylindrical member having at least one central axis, at least one radius and at least one outer circumference and such at least one cam adjuster comprises such at least one mounting aperture passing through such at least one engager such that such at least one mounting aperture is eccentrically located at a point adjacent to such at least one central axis).

Figure 23:
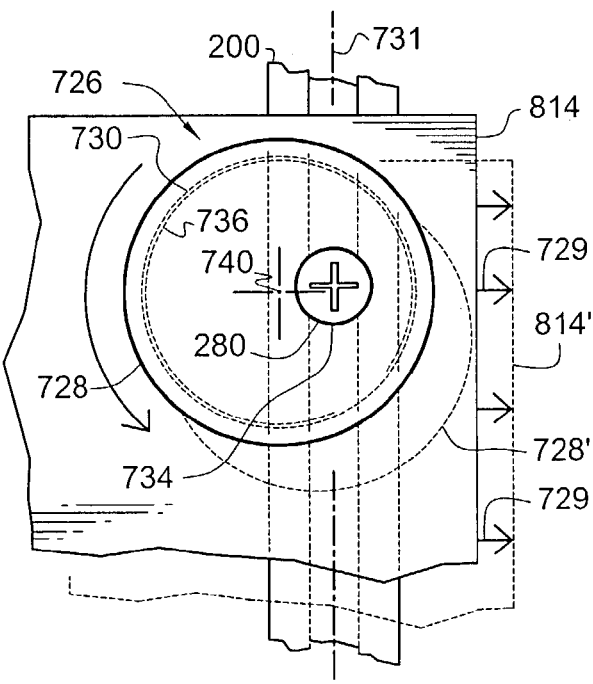
FIG. 23 is a diagram illustrating the operation of the cam mounting assembly according to the embodiment of FIG. 21.

FIG. 23 is a diagram illustrating the operation of cam mounting assembly 726 according to the preferred embodiment of FIG. 21. Screw 280, while engaged within mounting aperture 734, acts as pivot point around which tray cam insert 728 may be rotated. Preferably, as described in FIG. 22, mounting aperture 734 is eccentrically located with respect to center axis 740 of tray cam insert 728, as shown. Rotation of tray cam insert 728 permits engaging portion 736 to function as a cam (herein embodying at least one cam adjuster structured adapted to adjust the position of such at least one engager), producing a transverse positional movement 729 with respect to longitudinal axis 731, as shown (herein embodying wherein rotation of such at least one cam adjuster produces at least one substantially-transverse movement, relative to such at least one longitudinal axis of such at least one support bar, of both such at least one engager and the at least one avionics-component tray). As engaging portion 736 is preferably engaged within mounting hole 730 during rotation, an essentially identical transverse positional movement 729 is initiated in mounting tray 814, as shown.

Figure 24:
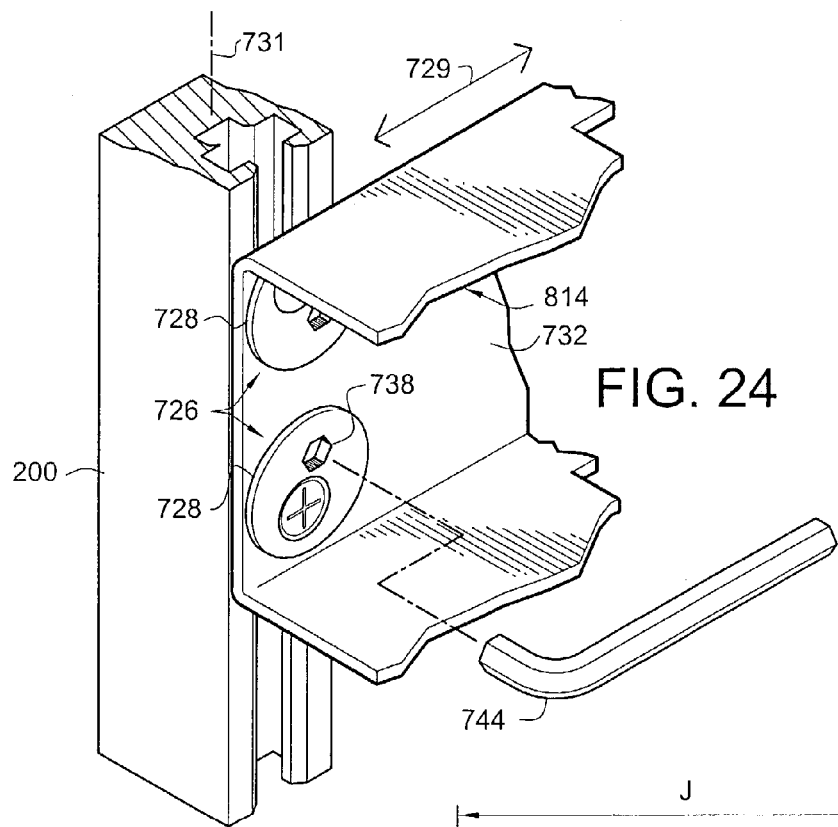
FIG. 24 is a perspective view, partially in section, illustrating the assembled adjustable cam mounting assembly of FIG. 21.

With reference to FIG. 24 and with continued reference to FIG. 21 and FIG. 22, FIG. 24 is a perspective view, partially in section, illustrating the assembled adjustable cam mounting assembly 726 of FIG. 21. At least one, preferably, two tray cam insert(s) 728 are used on each side 732 of mounting tray 814, as shown. Preferably, mounting hole 730 is sized to provide a snug but rotatable fit around outer circumference 742 of engaging portion 736 (herein embodying wherein such at least one mounting hole is adapted to receive such at least one essentially cylindrical member). Preferably, mounting hole 730 has a preferred inner diameter slightly greater than about 0.500 inch. Typically, mounting hole(s) 730 are retrofit within mounting tray 814 by drilling or punching (herein embodying the steps of establishing at least one suitable mounting position of the at least one avionics-components tray adjacent to such at least one longitudinal slot portion and providing within the at least one side of the at least one avionics-components tray at least one new mounting hole, aligning with such at least one longitudinal slot portion, to permit the at least one avionics-components tray to be mounted in the at least one suitable mounting position), however, under appropriate circumstances, mounting hole(s) 730 may be provided as an OEM feature. Preferably, to assist in rotation, tray cam insert 728 preferably comprises hex aperture 738 (herein embodying at least one rotation assister to assist in rotating such at least one engager) that is adapted to receive hand held hex wrench 744, as shown.

Figure 25:
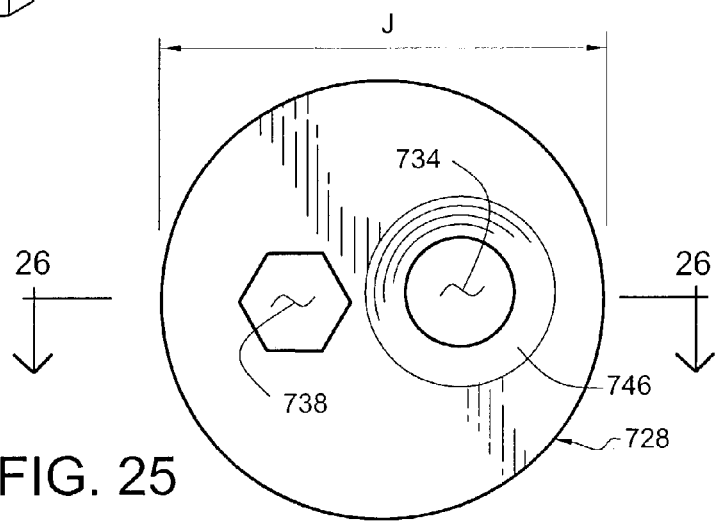
FIG. 25 is a front view of the tray cam insert according to the embodiment of FIG. 21.

FIG. 25 is a front view of tray cam insert 728 according to the embodiment of FIG. 21. Preferably, tray cam insert 728 has an outer diameter "J" of about 0.625 inch, as shown. Preferably, mounting aperture 734 comprises countersink screw receiver 746 to permit flush installation of screw 280.

Preferably, tray cam insert 728 is comprised of a rigid material, preferably cast and or milled 304 stainless steel. Those skilled in the art, upon reading the teachings of this specification, will appreciate that, under appropriate circumstances, considering such issues as intended service use and material cost, other materials, such as carbon steel, titanium, aluminum, ceramics or plastic, may suffice.

Figure 26:
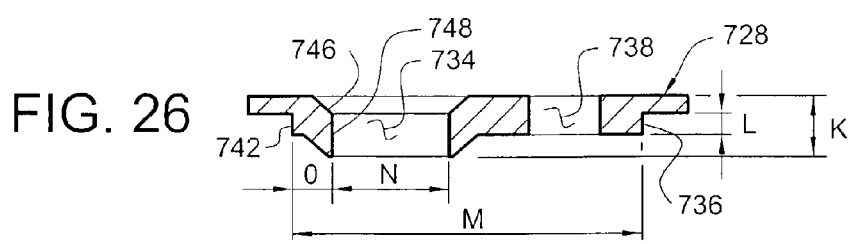
FIG. 26 is a sectional view 26—26 according to FIG. 25 of the tray cam insert.

FIG. 26 is a sectional view 26—26 according to FIG. 25 of tray cam insert 728. Tray cam insert 728 has a preferred overall thickness "K" of about 0.095 inch, as shown. Preferably, engaging portion 736 comprises a thickness "L" of about 0.065 inch, and a diameter "M" of 0.50 inch, as shown. Mounting aperture 734 has a preferred inner diameter "N" of 0.150 with an inner diameter edge 748 located a distance "O" of about 0.067 inch from outer circumference 742, as shown.

In a series of preferred installation steps, adjustable cam mounting assembly 726 is installed by inserting tray cam insert 728 through mounting hole 730 followed by inserting Screw 280, through mounting aperture 734 to loosely engage mounting nut assembly 300. Preferably, using hand held hex wrench 744, tray cam insert 728 is rotated to move mounting tray 814 to at least one user preferred position. With mounting tray 814 in a preferred position, Screw 280 is tightened to firmly attach mounting tray 814 to mounting rack component 200.

FIG. 27 is a front perspective view illustrating blanking plate 750 according to a preferred embodiment of the present invention. Often, revisions and updates in the quantity and placement of aircraft avionics leave portions of the instrument panel unused. Blanking plate 750 is preferably adapted to snap securely into mounting rack system 175 or multiple rack installation 500, permitting efficient instrument panel closeout of a partial avionics stack.

Preferably, blanking plate 750 (herein embodying at least one blanking cover adapted to cover unused portions of the general aviation aircraft cockpit instrument panel) comprises filler panel 752, retainer(s) 754 and preferably two retainer holder(s) 756, as shown. Preferably, filler panel 752 comprises blank front face 758 and rear face 760, as shown. Retainer holder 756 preferably comprises a plurality of holding apertures 762 adapted to removably hold one or more retainer(s) 754 in a fixed position relative to front face 758, as shown (herein embodying wherein such at least one retainer holder is adapted to adjustably hold such at least one retainer in at least one selected position relative to such at least one front face). Preferably, blanking plate 750 may comprise a number of different factory supplied heights (to accommodate various avionic combinations), and may be field cut to an exact height for specific and non-standard installations.

Under appropriate circumstances, filler panel 752 may be used as the base for an auxiliary switch 776 (shown in dashed lines) or circuit breaker panel. Preferably, except as noted below, blanking plate 750 comprises substantially aluminum construction preferably with an anodized finish, or under appropriate circumstances, a raw finish to allow for custom panel matching.

FIG. 28 is a top view further illustrating the arrangements of blanking plate 750 according to the embodiment of FIG. 27. Preferably, both retainer holder(s) 756 are firmly mounted to rear face 760, as shown. Preferably, each retainer holder 756 is essentially L-shaped comprising a projecting leg 764 and mounting leg 766 preferably joined to rear face 760, as shown. Preferably, mounting leg 766 is preferably affixed to rear face 760 by bonding. Those skilled in the art, upon reading the teachings of this specification, will appreciate that, under appropriate circumstances, considering such issues as cost and ease of manufacture, other methods of affixing mounting leg 766 to rear face 760, such as welding and mechanical fastening, may suffice. To prevent the bond between mounting leg 766 and rear face 760 from acting as an electrical isolator, at least one electrical grounding path (such as a point of metal-to-metal contact) is preferably established between mounting leg 766 and rear face 760.

Preferably, retainer 754 is removable from holding apertures 762 of retainer holder 756 to permit adjustments to the installed position of front face 758, as shown.

FIG. 29 is a top view, in partial section, illustrating the engagement of retainer 754 within mounting rack component 200 according to the embodiment of FIG. 27. Preferably, retainer 754 (herein embodying at least one spring loaded engager adapted to removably engage such at least one support bar) comprises a self-contained, spring-loaded plunger assembly having a rounded cylindrical nose 768, tapered cylindrical body 770 and circumferential flange 774, as shown. Preferably, cylindrical nose 768 is adapted to engage slot 772 of mounting rack component 200, as shown, and is held in position by the frictional spring force imparted by retainer 754. Preferably, retainer 754 comprises a commercially available unit similar in specification to the push-fit round-nose spring plunger model 8683A13 available from the McMaster-CARR Corporation of Atlanta, Ga.

Figure 30:
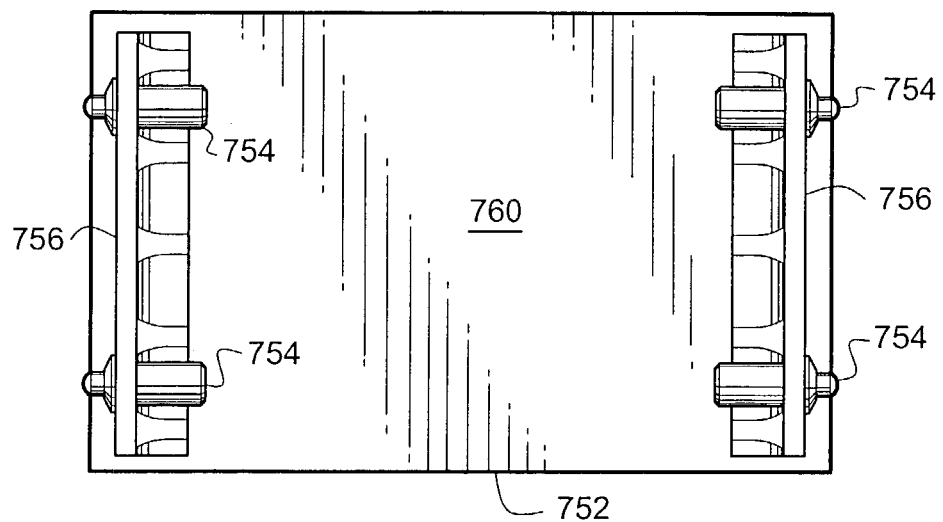
FIG. 30 is a rear view of the blanking plate according to the embodiment of FIG. 27.

FIG. 30 is a rear view of blanking plate 750 according to the embodiment of FIG. 27. Preferably, two retainer(s) 754 are used at each retainer holder 756 of blanking plate 750, as shown.

Figure 31:
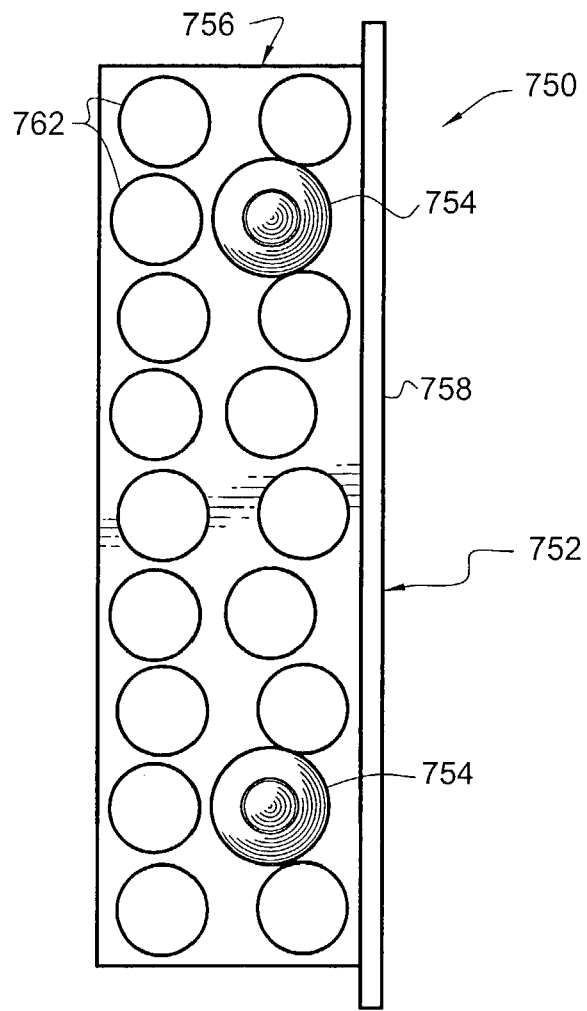
FIG. 31 is a side view of the blanking plate according to the embodiment of FIG. 27.

FIG. 31 is a side view of the blanking plate 750 according to the embodiment of FIG. 27. Preferably, retainer holder 756 (herein embodying at least one adjuster to adjust the position of such filler panel relative to the general aviation aircraft cockpit instrument panel) comprises a plurality of holding aperture(s) 762 adapted to receive and removably hold retainer(s) 754, as shown. Preferably, each holding aperture is uniquely positioned relative to filler panel 752 to provide an efficient means of adjusting the position of filler panel 752 relative to mounting rack component 200, as shown. Preferably, staggered pairs of holding aperture(s) 762 are arranged to permit at least one matching alignment of at least two retainer(s) 754 relative to front face 758, as shown.

Although applicant has described applicant's preferred embodiments of this invention, it will be understood that the broadest scope of this invention includes such modifications as diverse shapes and sizes and materials. Such scope is limited only by the below claims as read in connection with the above specification.

The invention claimed is:

1. A system for mounting in at least one aircraft cockpit instrument panel assembly at least one avionics-components tray having at least one side, at least one mounting hole in the side, and at least one mounting connector for making a connection through the mounting hole, comprising, in combination:
   a) at least one support bar, comprising at least one longitudinal axis and at least one first longitudinal face, structured and arranged to support the at least one avionics-component tray;
   b) at least one attacher adapted to attach the at least one avionics-component tray to said at least one support bar;

c) wherein said at least one attacher comprises at least one receiver adapted to receive the at least one mounting connector;
d) at least one slide structured and arranged to permit slicing said at least one attacher within said at least one support bar;
e) wherein said at least one slide comprises at least one holder adapted to slideably hold said at least one attacher within said at least one support bar; and
f) at least one connection system structured and arranged to nonslideably connect said at least one attacher within said at least one support bar when the at least one mounting connector is connected with said at least one receiver;
g) wherein, said at least one slide comprises at least one T-shaped-cross-section slot portion, of said at least one support bar, defining at least one continuous slot opening portion within said at least one first longitudinal face of said at least one support bar;
h) wherein said at least one support bar comprises at least one additional slot portion adapted to receive at least one mounting connector portion; and
i) wherein said at least one additional slot portion and said at least one T-shaped-cross-section slot portion, in combination, comprise at least one plus-shaped-cross-section slot portion.

2. The system according to claim 1 wherein each said at least one attacher comprises, in combination:
a) at least one retaining bracket;
b) at least one threaded nut in said retaining bracket;
c) at least one resilient spring in said retaining bracket;
d) wherein said at least one resilient spring is located between said at least one retaining bracket and said at least one nut.

3. The system according to claim 2 wherein said holder is structured and arranged so that said spring applies separation force between said at least one retaining bracket and said at least one nut.

4. The system according to claim 3 wherein said support bar is structured and arranged to removably attach to the cockpit instrument panel assembly.

5. The system according to claim 4 wherein said at least one support bar further comprises:
a) at least one substantially rectangular cross section; and
b) at least one second longitudinal face;
c) wherein said at least one second longitudinal face is located parallel to said at least one first longitudinal face.

6. The system according to claim 5 wherein:
a) each said at least one support bar further comprises at least two of said at least one T-shaped-cross-section slot portions;
b) at least one of said at least two T-shaped-cross-section slot portions defines at least one continuous slot opening portion within said at least one second longitudinal face of said at least one support bar.

7. The system according to claim 5 wherein said at least one continuous slot opening portion comprises at least one countersink receiver adapted to receive at least one countersunk mounting hole of the at least one avionics-component tray.

8. The system according to claim 5 wherein said wherein said at least one support bar further comprises:
a) at least one mountable portion; and
b) at least one mounting extension adapted to extend said at least one mountable portion beyond the substantially rectangular cross section.

9. The system according to claim 4 further comprising:
a) at least one quick-release adapter to adapt at least one quick-release connector to said at least one attacher;
b) wherein said at least one quick-release adapter comprises
i) at least one mount, to mount at least one avionics-component compatible with the at least one quick-release connector, in a position adjacent to said at least one support bar,
ii) at least one adjuster adapted to permit substantially-transverse positional adjustment of said at least one mount relative to said at least one longitudinal axis of said at least one support bar, and
iii) at least one mounting connector to connect said at least one quick-release adapter to said at least one attacher; and
c) wherein said at least one mount comprises at least one quick-release receiver adapted to receive and removably retain the at least one quick-release fastener.

10. The system according to claim 9 wherein said at least one quick-release receiver is adapted to receive a Dzus-type mounting connector.

11. The system according to claim 9 wherein:
a) said at least one adjuster comprises at least one first interlocker;
b) said at least one mount further comprises at least one second interlocker;
c) said at least one erst interlocker and said at least one second interlocker are structured and arranged to firmly interlock; and
d) said at least one first interlocker and said at least one second interlocker, when interlocked, prevent relative movement between said at least one adjuster and said at least one mount.

12. The system according to claim 11 wherein:
a) at least one portion of said at least one first interlocker comprises at least one first interlocking detent;
b) at least one portion of said at least one second interlocker comprises at least one second interlocking detent; and
c) said first at least one interlocking detents and said second at least one interlocking detents, when meshed, prevent relative movement between said at least one adjuster and said at least one mount;
d) wherein meshing of said said first and said second at least one interlocking detents prevents substantially-transverse positional movement of said at least one mount relative to the longitudinal axis of said at least one support bar.

13. The system according to claim 10 further comprising:
a) at least one spacer adapted to fit between said at least one mount and said at least one adjuster;
b) wherein said at least one spacer permits at least one Dzus-type avionics-component to be mounted in at least one aircraft cockpit instrument panel assembly adapted to receive the at least one avionics-components fray.

14. The system according to claim 4 further comprising:
a) at least one tray adjuster structured and arranged to permit positional adjustment of the at least one avionics-component tray relative to said at least one support bar;
b) wherein said at least one tray adjuster comprises,
i) at least one engager adapted to engage at least one portion of the at least one avionics-component tray;
ii) at least one cam adjuster structured adapted to adjust the position of said at least one engager;

iii) at least one mounting aperture to permit passage of the at least one mounting connector;
c) wherein rotation of said at least one cam adjuster produces at least one substantially-transverse movement, relative to said at least one longitudinal axis of said at least one support bar, of both said at least one engager and the at least one avionics-component tray.

15. The system according to claim 14 wherein:
a) said at least one engager comprises at least one essentially cylindrical member having at least one central axis, at least one radius and at least one outer circumference;
b) said at least one engager further comprises at least one rotation assister to assist in rotating said at least one engager; and
c) said at least one cam adjuster comprises said at least one mounting aperture passing through said at least one engager such that said at least one mounting aperture is eccentrically located at a point adjacent to said at least one central axis.

16. The system according to claim 15 further comprising:
a) at least one avionics-components tray;
b) wherein said at least one avionics-components tray comprises,
   i) at least one side, and
   ii) at least one mounting hole in said at least one side.

17. The system according to claim 16 wherein said at least one mounting hole is adapted to receive said at least one essentially cylindrical member.

18. The system according to claim 15 wherein the at least one radius of said at least one essentially cylindrical member is about one-half inch.

19. A system for mounting in at least one aircraft cockpit instrument panel assembly at least one avionics-components tray having at least one side, at least one mounting hole in the side, and at least one mounting connector for making a connection through the mounting hole, comprising, in combination:
a) at least one support bar, comprising at least one longitudinal axis and at least one first longitudinal face, structured and arranged to support the at least one avionics-component tray;
b) at least one attacher adapted to attach the at least one avionics-component tray to said at least one support bar;
c) wherein said at least one attacher comprises at least one receiver adapted to receive the at least one mounting connector;
d) at least one slide structured and arranged to permit sliding said at least one attacher within said at least one support bar;
e) wherein said at least one slide comprises at least one bolder adapted to slideably bold said at least one attacher within said at least one support bar;
f) at least one connection, system structured and arranged to nonslideably connect said at least one attacher within said at least one support bar when the at least one mounting connector is connecting with said at least one receiver; and
g) at least one blanking cover adapted to cover unused portions of the general aviation aircraft cockpit instrument panel;
h) wherein said at least one blanking cover comprises,
   i) at least one filler panel to fill such unused portions,
   ii) at least one retainer to removably retain said at least one filler panel on said at least one support bar,
   iii) at least one adjuster to adjust the position of said filler panel relative to the general aviation aircraft cockpit instrument panel.

20. The system according to claim 19 wherein:
a) said at least one filler panel comprises a substantially planar member having at least one front face and at least one rear face;
b) said at least one retainer comprises at least one spring loaded engager adapted to removably engage said at least one support bar;
c) said at least one adjuster comprises at least one retainer holder, firmly coupled to said at toast one rear face; and
d) said at least one retainer holder is adapted to adjustably hold said at least one retainer in at least one selected position relative to said at least one front face.

21. The system according to claim 20 wherein:
a) said at least one retainer holder comprises a plurality of holding apertures adapted to receive and removably bold said at least one retainer;
b) each one of said plurality of holding apertures is uniquely positioned relative to said at least one filler panel; and
c) at least two of said plurality of holding apertures are arranged to permit at least one matching alignment of at least two of said at least one retainers relative to said at least one front face.

22. The system according to claim 19 wherein said at least one support bar comprises at least two of said at least one slides.

23. The system according to claim 19 wherein said at least one support bar further comprises:
a) at least one mountable portion; and
b) at least one mounting extension adapted to extend said at least one mountable portion of said at least one support bar.

24. The system according to claim 19 wherein:
a) said at least one support bar comprises at least one contour structured and arranged to match at least one contoured portion of the general aviation aircraft cockpit instrument panel assembly.

25. A method of using, in at least one aircraft cockpit instrument panel assembly, side mounting bars for mounting at least one avionics-components tray having at least one side, at least one mounting hale in the side, and at least one mounting connector for making a connection through the mounting hole, comprising in combination, the steps of:
a) accessing at least one mounting bar comprising at least one longitudinal slot portion holding at least one unattached spring loaded slideably adjustable attacher;
b) selecting an unattached one of such at least one unattached spring loaded slideably adjustable attacher;
c) pressing such spring loaded slideably adjustable attacher to release friction between such spring loaded slideably adjustable attacher and such longitudinal slot portion;
d) moving such spring loaded slideably adjustable attacher to a user preferred location within such longitudinal slot portion; and
e) releasing such spring loaded slideably adjustable attacher within such longitudinal slot portion at such user preferred location.

26. The method according to claim 25 further comprising the step of attaching the at least one mounting connector of the at least one avionics-components tray to such at least one spring loaded slideably adjustable attacher.

27. The method according to claim 26 further comprising the steps of:
 a) inserting at least one tray adjuster through the at least one mounting hole;
 b) inserting the at least one mounting connector through such at least one tray adjuster to loosely engage the at least one mounting connector of the at least one avionics-components tray to such at least one spring loaded slideably adjustable attacher;
 c) adjusting such at least one tray adjuster to move the at least one avionics-components tray to at least one user preferred position; and
 d) tightening the at least one mounting connector to firmly attach the at least one avionics-components tray to such at least one spring loaded slideably adjustable attacher.

* * * * *

UNITED STATES PATENT AND TRADEMARK OFFICE
CERTIFICATE OF CORRECTION

PATENT NO. : 7,032,862 B2
APPLICATION NO. : 10/391039
DATED : April 25, 2006
INVENTOR(S) : Landes et al.

It is certified that error appears in the above-identified patent and that said Letters Patent is hereby corrected as shown below:

Column 25, line 5, "slicing" should read --sliding--

Column 26, line 28, "erst" should read --first--

Column 26, line 57, "fray" should read --tray--

Column 27, line 59, "connecting" should read --connected--

Column 28, line 12, "toast" should read --least--

Column 28, line 20, "bold" should read --hold--

Column 28, line 45, "hale" should read --hole--

Signed and Sealed this

Twenty-second Day of August, 2006

JON W. DUDAS
*Director of the United States Patent and Trademark Office*